(12) United States Patent
Shoji et al.

(10) Patent No.: US 7,534,629 B2
(45) Date of Patent: May 19, 2009

(54) MANUFACTURING METHOD OF SEMICONDUCTOR INTEGRATED CIRCUIT DEVICE

(75) Inventors: Teruo Shoji, Tokyo (JP); Akio Hasebe, Tokyo (JP); Yoshinori Deguchi, Tokyo (JP); Motoji Murakami, Tokyo (JP); Masayoshi Okamoto, Hitachinaka (JP); Yasunori Narizuka, Tokyo (JP); Susumu Kasukabe, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 437 days.

(21) Appl. No.: 11/448,071

(22) Filed: Jun. 7, 2006

(65) Prior Publication Data

US 2006/0281222 A1 Dec. 14, 2006

(30) Foreign Application Priority Data

Jun. 8, 2005 (JP) ............................. 2005-168112

(51) Int. Cl.
 *H01L 21/66* (2006.01)
(52) U.S. Cl. ................................. 438/14; 257/E21.531
(58) Field of Classification Search ........................ None
 See application file for complete search history.

(56) References Cited

U.S. PATENT DOCUMENTS 6,305,230 B1   10/2001   Kasukabe et al.
7,271,015 B2 *  9/2007   Okamoto et al. .............. 438/14
2005/0227383 A1 * 10/2005 Okamoto et al. .............. 438/14

FOREIGN PATENT DOCUMENTS

| JP | 7-283280   | 10/1995 |
|----|------------|---------|
| JP | 8-50146    | 2/1996  |
| JP | 8-201427   | 8/1996  |
| JP | 10-308423  | 11/1998 |
| JP | 11-023615  | 1/1999  |
| JP | 11-97471   | 4/1999  |
| JP | 2000-150594| 5/2000  |
| JP | 2001-159643| 6/2001  |

* cited by examiner

*Primary Examiner*—Scott B. Geyer
*Assistant Examiner*—Andre' Stevenson
(74) *Attorney, Agent, or Firm*—Antonelli, Terry, Stout & Kraus, LLP.

(57) ABSTRACT

By using a membrane probe formed by using a manufacturing technique for semiconductor integrated circuit devices, the yield of probing collectively performed on a plurality of chips is to be enhanced. A probe card is formed by using a plurality of pushers, each pusher being formed of a POGO pin insulator, POGO pins, an FPC connector, a membrane probe HMS, an impact easing sheet, an impact easing plate, a chip condenser YRS and so on, wherein one or two POGO pins press a plurality of metal films arranged like islands. One or more cuts are made into what matches the chip to be tested in the area of the membrane probe in a direction substantially parallel to the extending direction of wiring electrically connected to probes formed in the membrane probe.

24 Claims, 30 Drawing Sheets

FIG. 31

| QUANTITY OF OVERDRIVE (μm) | LOAD PER POGO PIN (g) | LOAD PER PROVE (g) | INCREASE RATE OF LOAD PER PROVE |
|---|---|---|---|
| 20 | 4.9686 | 1.6562 | 94.77 |
| 40 | 5.0372 | 1.6791 | 96.07 |
| 60 | 5.1058 | 1.7019 | 97.38 |
| 80 | 5.1744 | 1.7248 | 98.69 |
| 100 | 5.243 | 1.7477 | 100 |
| 120 | 5.3116 | 1.7705 | 101.31 |
| 140 | 5.3802 | 1.7934 | 102.62 |
| 160 | 5.4488 | 1.8163 | 103.93 |
| 180 | 5.5174 | 1.8391 | 105.23 |
| 200 | 5.586 | 1.862 | 106.54 |

MANUFACTURING METHOD OF SEMICONDUCTOR INTEGRATED CIRCUIT DEVICE

BACKGROUND OF THE INVENTION

The present invention relates to a manufacturing method of semiconductor integrated circuit devices, and more particularly to a technique that can be effectively applied to electrical testing of semiconductor integrated circuit devices which is performed by pressing the probe styluses of a probe card against the electrode pads of each semiconductor integrated circuit device.

In each of Japanese Unexamined Patent Publication No. Hei 7(1995)-283280 (Patent Document 1), Japanese Unexamined Patent Publication No. Hei 8(1996)-50146 (Patent Document 2 (corresponding PCT: International Publication WO 95-34000)), Japanese Unexamined Patent Publication No. Hei 8(1996)-201427 (Patent Document 3), Japanese Unexamined Patent Publication No. Hei 10(1998)-308423 (Patent Document 4), Japanese Unexamined Patent Publication No. Hei 11(1999)-23615 (Patent Document 5 (corresponding U.S. Patent publication: U.S. Pat. No. 6,305,230)), Japanese Unexamined Patent Publication No. Hei 11(1999)-97471 (Patent Document 6 (corresponding European Patent Publication: EP 1022775)), Japanese Unexamined Patent Publication No. 2000-150594 (Patent Document 7 (corresponding European Patent Publication: EP 0999451)), and Japanese Unexamined Patent Publication No. 2001-159643 (Patent Document 8), there are disclosed the structure of a prober having probe styluses (contact terminals), an insulating film and wiring for tapping, formed by using a manufacturing technique for semiconductor integrated circuit devices, a manufacturing method thereof, and a technique by which the use of that prober makes possible probing even of chips whose test pads are narrowed in pitch.

Patent Document 1: Japanese Unexamined Patent Publication No. Hei 7(1995)-283280

Patent Document 2: Japanese Unexamined Patent Publication No. Hei 8(1996)-50146

Patent Document 3: Japanese Unexamined Patent Publication No. Hei 8(1996)-201427

Patent Document 4: Japanese Unexamined Patent Publication No. Hei 10(1998)-308423

Patent Document 5: Japanese Unexamined Patent Publication No. Hei 11(1999)-23615

Patent Document 6: Japanese Unexamined Patent Publication No. Hei 11(1999)-97471

Patent Document 7: Japanese Unexamined Patent Publication No. 2000-150594

Patent Document 8: Japanese Unexamined Patent Publication No. 2001-159643

SUMMARY OF THE INVENTION

Available techniques for inspection of semiconductor integrated circuit devices include probing. This probing includes functional testing to check whether or not the device functions as prescribed and testing to distinguish between acceptable and defective products by examining their DC operating characteristics and AC operating characteristics. A technique of probing a device in its wafer state is used to meet wafer shipping (qualitative differentiation) requirements, KGD (known good die) requirements (enhancing the yield of MCPs (multi-chip packages)) and the requirement for total cost reduction.

In recent years, multi-functionalization of semiconductor integrated circuit devices has so much progressed that even a plurality of circuits are built into a single semiconductor chip (hereinafter referred to as simply "chip"). Further, with a view to suppressing the manufacturing cost of semiconductor integrated circuit devices, attempts are being made to miniaturize semiconductor elements and wiring to reduce the area of a semiconductor chip (hereinafter referred to as simply "chip") and to increase the number of chips acquired per semiconductor wafer (hereinafter referred to as simply "wafer"). For this purpose, not only the number of test pads (bonding pads) is increased, but the test pads are arranged at a narrower pitch and the areas of test pads are reduced. Along with this pitch narrowing of test pads, where a prober having cantilever-shaped probe styluses is to be used for the probing, there arises a problem that it is difficult to install the probe styluses matched with the arranged positions of the test pads to be probed.

Moreover, along with the capacity expansion of memory products, which constitute a type of semiconductor integrated circuit devices, and an increase in logic products with built-in memories, another type of semiconductor integrated circuit devices, the length of time taken by probing in the wafer state is extended. For this reason, it is required to enhance the throughput of probing in the wafer state. In order to enhance this throughput, it is necessary to reduce the testing time taken per wafer. The testing time $T0$ taken per wafer is represented by $T0=(T1+T2)\times N+T3$ where $T1$ is the time taken by the testing apparatus per test is $T2$, the time taken to index the prober, $N$ is the number of times the probe styluses (probing needles) the prober come into contact with the wafer (hereinafter referred as the number of touchdowns), and $T3$ is the time taken replace the wafer. This equation reveals that enhancing the throughput of probing in the wafer state requires a reduction in the number of touchdowns. Incidentally, at high temperature, the waiting time is extended as long as the time taken for the heat ventilation to end.

The present inventors have been trying to find out a technique which allows probing of chips even if the pitch of test pads is narrowed thereon by using a prober having probe styluses formed by using a manufacturing technique for semiconductor integrated circuit devices, particularly a technique which allows a reduction in the number of touchdowns by collectively probing a plurality of chips. In the course of this research, the inventors identified the following problem.

Thus, these probe styluses are part of a membrane probe formed by stacking metal films and polyimide films and patterning them by using a manufacturing technique for semiconductor integrated circuit devices, and disposed on the main face side of a membrane probe opposite the chip to be tested. At the time of probing, the membrane probe in the area where the probe styluses are formed is pressed from the rear side, namely the other than the main face side with a pressing tool including a 42 alloy or the like and having a flat pressing face. During the probing, after the probe styluses are brought into contact with the test pads, that contact leaves depressions, and there are differences in extent (relative size of the depressed area) among a plurality of depressions. This is because the pressure from the pressing tool having a flat pressing face causes the probe styluses to be pressed against test pads and the uneven heights of the plurality of test pads manifest themselves as differences in the extent of depressions. The height differences among the plurality of test pads increases with the number of chips to which the probe styluses are brought into contact at a time, and the differences in the extent of depressions also increase accordingly. Where the depressions are too indistinct, the contact resistances of the contact parts between the probe styluses and the test pads become too high, which may make it impossible to accurately measure the electrical resistances of the circuits within the chip. For this reason, there is a problem that, if the pressure from the pressing tool on the membrane probe is increased, the probe stylus may be crushed or otherwise damaged where the depressions are more distinct. On the other hand, where the depressions are less distinct, if the pressure from the pressing tool on the membrane probe is reduced to prevent the probe stylus from being damaged, there will be another problem that no adequate contact between the probe stylus and the test pad can be secured where the depressions are less distinct. Thus, pressing the membrane probe with a pressing tool having a flat pressing face involves the risk of failing to appropriately control the pressure on every probe stylus.

Adjusting the membrane probe or the like to improve the differences among the depressions in distinctiveness by uniformizing the contact pressures between the probe styluses and the respectively matching test pads would take a long time as well as a high skill level.

Further, when the pressing tool presses a membrane probe, the pressure is generated by the pressing of one central point of the pressing tool by a pressing pin, and the pressing face, namely the main face of the membrane probe, follows the main face of the wafer demarcated in a plurality of chip areas. On the other face of the membrane probe, thin elastic members are arranged in positions matching test pads on the chip, and the pressing tool presses the membrane probe via these elastic member, and the differences in load arising between the probe stylus first coming into contact with a test pad and the probe stylus last coming into contact with a test pad are controlled by displacing the pressing face in the vertical direction. However, along with an increase in the number of chips brought into contact with probe styluses at a time, the faces of contact are expanded and the height differences among the test pads widen, resulting in a loss margin for the displacement of that pressing face. Since this may give rise to some test pads unable to come into contact with probe styluses securely, the extent of displacement may be increased to increase the loads working on the probe styluses, but the probe styluses early coming into contact with test pads including the first one may become deformed (damaged).

If any foreign matter is stuck to the main face of the wafer at the time of probing, when this foreign matter and any probe stylus come into contact with each other, a displacement in the vertical direction will occur in the contact part of the membrane probe. Such a displacement in the vertical direction would invite concentration of load on the probe stylus having come into contact with the foreign matter, and the probe stylus would be deformed or damaged.

Also, as the membrane probe is structured of a single thin sheet, even if only a part of the probe stylus is broken, the whole sheet will have to be replaced. As a result, the replacement of the membrane probe including the adjustment of the whole newly fitted membrane probe will take a long time, making the replacement a time-consuming and massive work. Moreover, even if only a part of the probe stylus is damaged, the whole membrane probe has to be replaced, which would push up the maintenance cost.

Furthermore, since the membrane probe is pressed with a pressing tool from behind as described above, if temperature, high or low, is applied to this pressed part, the membrane probe and the pressing tool will be expanded or contracted by the heat. As this expansion or contraction varies the coordinates of the probe stylus in the direction along the main face of the wafer, when the membrane probe is to be used, pre-heating or pre-cooling should be applied until the coordinate variation due to the heat ends. However, this thermal expansion or contraction of the membrane probe also takes a very long time.

The probe stylus is arranged at the center of the main face of the membrane probe and a fine conductor wiring pattern tapped from the probe stylus extends to the outer circumference of the membrane probe and pressure-fitted to the substrate for the testing apparatus. For this reason, the fine conductor wiring pattern tends to take a long parallel wiring form and increase in resistance, resulting in poor characteristics in respect of electric current, noise and other respects.

When a probe stylus is to be brought into contact with a test pad, if the chip to be tested is positioned on the outer circumference of the wafer, some probe styluses will come into contact with test pads while others will be away from the wafer and fail to come into contact with test pads. In this case, as the membrane probe will be inclined when a probe stylus and the membrane probe are brought into contact, if the probe stylus positioned on the borderline of coming away from the wafer, stresses will concentrate on that probe stylus on the borderline. As a result, that probe stylus will become deformed, and the deformed probe stylus will be unable to come into contact with any test pad in the next test.

The object of one typical aspect of the invention disclosed in this application is to provide a technique by which the yield of probing, applied collectively to a plurality of chips, can be enhanced by using a membrane probe by using a manufacturing technique for semiconductor integrated circuit devices.

The object of another typical aspect of the invention disclosed in this application is to reduce the length of time taken to perform probing in a manufacturing process of semiconductor integrated circuit devices.

A typical one of the aspects of the invention disclosed in this application will be briefly summarized below.

A manufacturing method of semiconductor integrated circuit devices according to the invention includes the following steps.

(a) preparing a semiconductor wafer which is partitioned into a plurality of chip areas, a semiconductor integrated circuit being formed in each of the plurality of chip areas, and in which a plurality of first electrodes to be electrically connected to the semiconductor integrated circuits are formed over the main face thereof;

(b) preparing a first card having a wiring board over which a first wiring is formed; a plurality of first sheets wherein a plurality of contact terminals to be brought into contact with the plurality of first electrodes and a second wiring to be electrically connected to the plurality of contact terminals are formed, the second wiring is electrically connected to the first wiring, and the tips of the plurality of contact terminals are opposite the main face of the semiconductor wafer, a plurality of sheet holding devices which hold on the bottom face matching ones of the plurality of first sheets and are held by the wiring board, a plurality of third wirings for electrically connecting the second wiring and the first wiring, and a plurality of pressing mechanisms for pressing from the rear face a plurality of first areas out of the first sheets in which one or more of the contact terminals are formed; and (c) electrically testing the semiconductor integrated circuits by bringing the tips of the plurality of contact terminals into contact with the plurality of first electrodes.

The plurality of first sheets are formed by a process including the steps of:

(b1) preparing one first substrate having crystallinity;

(b2) forming a plurality of pyramidal or prismoidal first holes by selectively and anisotropically etching the first substrate;

(b3) selectively forming above each of the plurality of first holes a plurality of first metal films into which the plurality of first holes are to be embedded;

(b4) forming a first polyimide film over the first substrate and the plurality of first metal films;

(b5) forming a plurality of first openings reaching the plurality of first metal films by selectively etching the first polyimide film;

(b6) forming over the first polyimide film a second metal film into which the plurality of first openings are to be embedded, and forming by patterning the second metal film a plurality of the second wirings to be electrically connected to the plurality of first metal films;

(b7) forming a second polyimide film over the plurality of second wirings and the first polyimide film;

(b8) adhering a second sheet onto the first substrate, and forming by patterning the second sheet a plurality of second openings in the second sheet over the first metal film;

(b9) forming a plurality of elastomers to be embedded into the plurality of second openings, in a state in which the second sheet is adhered onto the first substrate, in the plurality of second openings;

(b10) removing the first substrate, forming the plurality of contact terminals from the plurality of first metal films, and forming one thin-film sheet containing the plurality of contact terminals, the first and second polyimide films, the plurality of second wirings, the second sheet and the plurality of elastomers; and (b11) cutting the thin-film sheet along divided areas to form the plurality of first sheets.

Herein, one of the first sheets matches one or more of the chip areas, and the plurality of first sheets formed at step (b11) are incorporated into one first card.

The plurality of first sheets formed at step (b11) are used for electrical testing of semiconductor integrated circuits of a plurality of types, and incorporated into the first card for use in the electrical testing of the respectively corresponding semiconductor integrated circuits.

The plurality of first sheets are formed by a process including the steps of:

(b1) preparing one first substrate having crystallinity;

(b2) forming a plurality of pyramidal or prismoidal first holes by selectively and anisotropically etching the first substrate;

(b3) selectively forming above each of the plurality of first holes a plurality of first metal films into which the plurality of first holes are to be embedded;

(b4) forming a first polyimide film over the first substrate and the plurality of first metal films;

(b5) forming a plurality of first openings reaching the plurality of first metal films by selectively etching the first polyimide film;

(b6) forming over the first polyimide film a second metal film into which the plurality of first openings are to be embedded, and forming by patterning the second metal film a plurality of the second wirings to be electrically connected to the plurality of first metal films;

(b7) forming a second polyimide film over the plurality of second wirings and the first polyimide film;

(b8) adhering a second sheet onto the first substrate, and forming by patterning the second sheet a plurality of second openings in the second sheet over the first metal film;

(b9) forming a plurality of elastomers to be embedded into the plurality of second openings, in a state in which the second sheet is adhered onto the first substrate, in the plurality of second openings;

(b10) removing the first substrate, forming the plurality of contact terminals from the plurality of first metal films, and forming one thin-film sheet containing the plurality of contact terminals, the first and second polyimide films, the plurality of second wirings, the second sheet and the plurality of elastomers; and (b11) cutting the thin-film sheet along divided areas to form the plurality of first sheets.

Herein, one of the first sheets matches one or more of the chip areas, and the plurality of first sheets formed at step (b11) are used for electrical testing of semiconductor integrated circuits of a plurality of types, and incorporated into one first card.

Other aspects of the summary disclosed in the present application can be briefly described in an itemized manner as follows.

1. A probe card comprising:

a wiring board over which a first wiring is formed;

a plurality of first sheets over which a plurality of contact terminals to be brought into contact with a plurality of first electrodes formed over the main face of a semiconductor wafer and a second wiring to be electrically connected to the plurality of contact terminals are formed, the second wiring being electrically connected to the first wiring, and the tips of the plurality of contact terminals opposing the main face of the semiconductor wafer;

a plurality of sheet holding devices which hold on the bottom face matching ones of the plurality of first sheets and are held by the wiring board, a plurality of third wirings for electrically connecting the second wiring and the first wiring, and a plurality of pressing mechanisms for pressing from the rear face a plurality of first areas out of the first sheets in which one or more of the contact terminals are formed;

wherein the plurality of first sheets are formed by a process including the steps of:

(b1) preparing one first substrate having crystallinity;

(b2) forming a plurality of pyramidal or prismoidal first holes by selectively and anisotropically etching the first substrate;

(b3) selectively forming above each of the plurality of first holes a plurality of first metal films into which the plurality of first holes are to be embedded;

(b4) forming a first polyimide film over the first substrate and the plurality of first metal films;

(b5) forming a plurality of first openings reaching the plurality of first metal films by selectively etching the first polyimide film;

(b6) forming over the first polyimide film a second metal film into which the plurality of first openings are to be embedded, and forming by patterning the second metal film a plurality of the second wirings to be electrically connected to the plurality of first metal films;

(b7) forming a second polyimide film over the plurality of second wirings and the first polyimide film;

(b8) adhering a second sheet onto the first substrate, and forming by patterning the second sheet a plurality of second openings in the second sheet over the first metal film;

(b9) forming a plurality of elastomers to be embedded into the plurality of second openings, in a state in which the second sheet is adhered onto the first substrate, in the plurality of second openings;

(b10) removing the first substrate, forming the plurality of contact terminals from the plurality of first metal films, and forming one thin-film sheet containing the plurality of contact terminals, the first and second polyimide films, the plurality of second wirings, the second sheet and the plurality of elastomers; and (b11) cutting the thin-film sheet along divided areas to form the plurality of first sheets, wherein a plurality of chip areas are partitioned in the semiconductor wafer, a semiconductor integrated circuit is formed in each of the chip areas, and the plurality of first electrodes are electrically connected to the semiconductor integrated circuits, and one of the first sheets matches one or more of the plurality of chip areas;

one probe card being assembled by using the plurality of first sheets formed at the step (b11).

2. The probe card according to paragraph 1,
wherein the third wiring is tapped from the first sheet in a single direction.

3. The probe card according to paragraph 2,
wherein the third wiring is an FPC wiring.

4. The probe card according to paragraph 1,
wherein a bypass condenser is electrically connected to the third wiring.

5. The probe card according to paragraph 1,
wherein the second sheet is arranged in each of the first areas over the rear face of the first sheet;
wherein each of the first areas is arranged in the chip area in a position matching one or another of a plurality of second areas in which one or more of the first electrodes is arranged; and
wherein a matching one of pressing mechanisms presses each of the second sheets.

6. The probe card according to paragraph 1,
wherein the sheet holding device is held by the wiring board via a fixing device for fixing the sheet holding device to the wiring board; and
wherein the fixing device is formed of a material whose thermal expansion or thermal contraction is rapidly saturated at a temperature of conducting electrical testing of semiconductor integrated circuits by bringing into contact the tips of the plurality of contact terminals.

7. The probe card according to paragraph 5,
wherein the fixing device mainly includes titanium.

8. The probe card according to paragraph 1,
wherein the electrical testing of the semiconductor integrated circuits in a plurality of the chip areas is collectively accomplished by one time of contact between the plurality of contact terminals and the plurality of first electrodes.

9. A probe card comprising:
a wiring board over which a first wiring is formed;
a plurality of first sheets over which a plurality of contact terminals to be brought into contact with a plurality of first electrodes formed over the main face of a semiconductor wafer and a second wiring to be electrically connected to the plurality of contact terminals are formed, the second wiring being electrically connected to the first wiring, and the tips of the plurality of contact terminals opposing the main face of the semiconductor wafer;
a plurality of sheet holding devices which hold on the bottom face matching ones of the plurality of first sheets and are held by the wiring board,
a plurality of third wirings for electrically connecting the second wiring and the first wiring, and
a plurality of pressing mechanisms for pressing from the rear face a plurality of first areas out of the first sheets in which one or more of the contact terminals are formed;
wherein the plurality of first sheets are formed by a process including the steps of:
(b1) preparing one first substrate having crystallinity;

(b2) forming a plurality of pyramidal or prismoidal first holes by selectively and anisotropically etching the first substrate;

(b3) selectively forming above each of the plurality of first holes a plurality of first metal films into which the plurality of first holes are to be embedded;

(b4) forming a first polyimide film over the first substrate and the plurality of first metal films;

(b5) forming a plurality of first openings reaching the plurality of first metal films by selectively etching the first polyimide film;

(b6) forming over the first polyimide film a second metal film into which the plurality of first openings are to be embedded, and forming by patterning the second metal film a plurality of the second wirings to be electrically connected to the plurality of first metal films;

(b7) forming a second polyimide film over the plurality of second wirings and the first polyimide film;

(b8) adhering a second sheet onto the first substrate, and forming by patterning the second sheet a plurality of second openings in the second sheet over the first metal film;

(b9) forming a plurality of elastomers to be embedded into the plurality of second openings, in a state in which the second sheet is adhered onto the first substrate, in the plurality of second openings;

(b10) removing the first substrate, forming the plurality of contact terminals from the plurality of first metal films, and forming one thin-film sheet containing the plurality of contact terminals, the first and second polyimide films, the plurality of second wirings, the second sheet and the plurality of elastomers; and (b11) cutting the thin-film sheet along divided areas to form the plurality of first sheets, wherein a plurality of chip areas are partitioned in the semiconductor wafer, a semiconductor integrated circuit is formed in each of the chip areas, and the plurality of first electrodes are electrically connected to the semiconductor integrated circuits, and one of the first sheets matches one or more of the plurality of chip areas;

wherein the plurality of first sheets formed at the step (b11) are used for the electrical testing of semiconductor integrated circuits of a plurality of types, each being incorporated into the first card for use in the electrical testing of the matching semiconductor integrated circuit.

10. The probe card according to paragraph 9,
wherein the third wiring is tapped from the first sheet in a single direction.

11. The probe card according to paragraph 10,
wherein the third wiring is an FPC wiring.

12. The probe card according to paragraph 9,
wherein a bypass condenser is electrically connected to the third wiring.

13. The probe card according to paragraph 9,
wherein the second sheet is arranged in each of the first areas over the rear face of the first sheet;
wherein each of the first areas is arranged in the chip area in a position matching one or another of a plurality of second areas in which one or more of the first electrodes is arranged; and
wherein a matching one of pressing mechanisms presses each of the second sheets.

14. The probe card according to paragraph 9,
wherein the sheet holding device is held by the wiring board via a fixing device for fixing the sheet holding device to the wiring board; and
wherein the fixing device is formed of a material whose thermal expansion or thermal contraction is rapidly saturated at a temperature of conducting electrical testing of semiconductor integrated circuits by bringing into contact the tips of the plurality of contact terminals.

15. The probe card according to paragraph 14,
wherein the fixing device mainly includes titanium.

16. The probe card according to paragraph 9,
wherein the electrical testing of the semiconductor integrated circuits in a plurality of the chip areas is collectively accomplished by one time of contact between the plurality of contact terminals and the plurality of first electrodes.

17. A probe card comprising:
a wiring board over which a first wiring is formed;
a plurality of first sheets over which a plurality of contact terminals to be brought into contact with a plurality of first electrodes formed over the main face of a semiconductor wafer and a second wiring to be electrically connected to the plurality of contact terminals are formed, the second wiring being electrically connected to the first wiring, and the tips of the plurality of contact terminals opposing the main face of the semiconductor wafer;
a plurality of sheet holding devices which hold on the bottom face matching ones of the plurality of first sheets and are held by the wiring board,
a plurality of third wirings for electrically connecting the second wiring and the first wiring, and
a plurality of pressing mechanisms for pressing from the rear face a plurality of first areas out of the first sheets in which one or more of the contact terminals are formed;
wherein the plurality of first sheets are formed by a process including the steps of:

(b1) preparing a plurality of first substrates having crystallinity;

(b2) forming a plurality of pyramidal or prismoidal first holes by selectively and anisotropically etching the plurality of first substrates;

(b3) selectively forming above each of the plurality of first holes a plurality of first metal films into which the plurality of first holes are to be embedded;

(b4) forming a first polyimide film over the plurality of first substrates and the plurality of first metal films;

(b5) forming a plurality of first openings reaching the plurality of first metal films by selectively etching the first polyimide film;

(b6) forming over the first polyimide film a second metal film into which the plurality of first openings are to be embedded, and forming by patterning the second metal film a plurality of the second wirings to be electrically connected to the plurality of first metal films;

(b7) forming a second polyimide film over the plurality of second wirings and the first polyimide film;

(b8) adhering a second sheet onto the plurality of first substrates, and forming by patterning the second sheet a plurality of second openings in the second sheet over the first metal film;

(b9) forming a plurality of elastomers to be embedded into the plurality of second openings, in a state in which the second sheet is adhered onto the first substrate, in the plurality of second openings;

(b10) removing the plurality of first substrates, forming the plurality of contact terminals from the plurality of first metal films, and forming a plurality of thin-film sheets containing the plurality of contact terminals, the first and second polyimide films, the plurality of second wirings, the second sheet and the plurality of elastomers; and (b11) cutting the plurality of thin-film sheets along divided areas to form the plurality of first sheets, wherein a plurality of chip areas are partitioned in the semiconductor wafer, a semiconductor integrated circuit is formed in each of the chip areas, and the plurality of first electrodes are electrically connected to the semiconductor integrated circuits, and one of the first sheets matches one or more of the plurality of chip areas;

wherein the plurality of first sheets formed at the step (b11) are used for the electrical testing of semiconductor integrated circuits of a plurality of types, one probe card being assembled by using the plurality of first sheets.

18. The probe card according to paragraph 17,
wherein the third wiring is tapped from the first sheet in a single direction.

19. The probe card according to paragraph 18,
wherein the third wiring is an FPC wiring.

20. The probe card according to paragraph 17,
wherein a bypass condenser is electrically connected to the third wiring.

21. The probe card according to paragraph 17,
wherein the second sheet is arranged in each of the first areas over the rear face of the first sheet;
wherein each of the first areas is arranged in the chip area in a position matching one or another of a plurality of second areas in which one or more of the first electrodes is arranged; and
wherein a matching one of pressing mechanisms presses each of the second sheets.

22. The probe card according to paragraph 17,
wherein the sheet holding device is held by the wiring board via a fixing device for fixing the sheet holding device to the wiring board; and
wherein the fixing device is formed of a material whose thermal expansion or thermal contraction is rapidly saturated at a temperature of conducting electrical testing of semiconductor integrated circuits by bringing into contact the tips of the plurality of contact terminals.

23. The probe card according to paragraph 22,
wherein the fixing device mainly includes titanium.

24. The probe card according to paragraph 17,
wherein the electrical testing of the semiconductor integrated circuits in a plurality of the chip areas is collectively accomplished by one time of contact between the plurality of contact terminals and the plurality of first electrodes.

Other aspects of the summary disclosed in the present application can be briefly described in an itemized manner as follows.

25. A wafer process resembling stylus, a stylus for wiring integrated sheets, a probe card using a wiring integration process (a combination of a probing stylus, wiring integrated sheet assembly, namely a stylus, wiring integrated thin-film sheet and a mechanism to hold them, tap wiring and so forth) for use in fabricating semiconductor integrated circuit devices, wherein the stylus and wiring integrated sheet include a plurality of sub-sheets (or fabrication of a plurality of probe cards by separating a plurality of sub-sheets from single sheets enables probe cards of relatively small areas to be easily prepared).

26. According to paragraph 25, the plurality of sub-sheets are separated from a single stylus or a wiring integrated thin-film sheet.

27. According to paragraph 25, the plurality of sub-sheets are separated from a plurality of stylus or wiring integrated thin-film sheets.

28. According to any of paragraphs 25 through 27, a manufacturing method for semiconductor integrated circuit devices or semiconductor devices intended for electrical testing by using a the probe card.

29. According to paragraph 28, the electrical testing is performed within the same contact step single or a plurality of chip areas (basically two or more, preferably eight or more, and even more preferably 32 or more) on the main face of the semiconductor wafer to be tested.

30. According to paragraph 28, the electrical testing is performed within the same contact step substantially all the chip areas on the main face of the semiconductor wafer to be tested (including so-called wafer level testing and execution on chip areas of 40% or more within the same stylus contact step).

31. According to any of paragraphs 25 through 30, each of the plurality of sub-sheets has a substantially rectangular shape.

32. According to paragraph 31, tapping of wiring from each individual sub-sheet is accomplished with a connector from the long side.

33. According to any of paragraphs 25 through 32, the plurality of styluses which the plurality of sub-sheets have are pressurized individually or in a group of mutually close n ones (n=2 to 8) by a POGO pin.

The advantages provided by typical aspects of the invention disclosed herein are briefly summarized below.

By using a membrane probe formed by using a manufacturing technique for semiconductor integrated circuit devices, the yield of probing collectively performed on a plurality of chips can be enhanced.

BRIEF DESCRIPTION OF THE DRAWINGS

FIG. 31 also illustrates how the load per probe increases with an increase in the quantity of the overdrive of the probe card shown in FIG. 1;

DETAILED DESCRIPTION OF THE PREFERRED EMBODIMENTS

Figure 1:
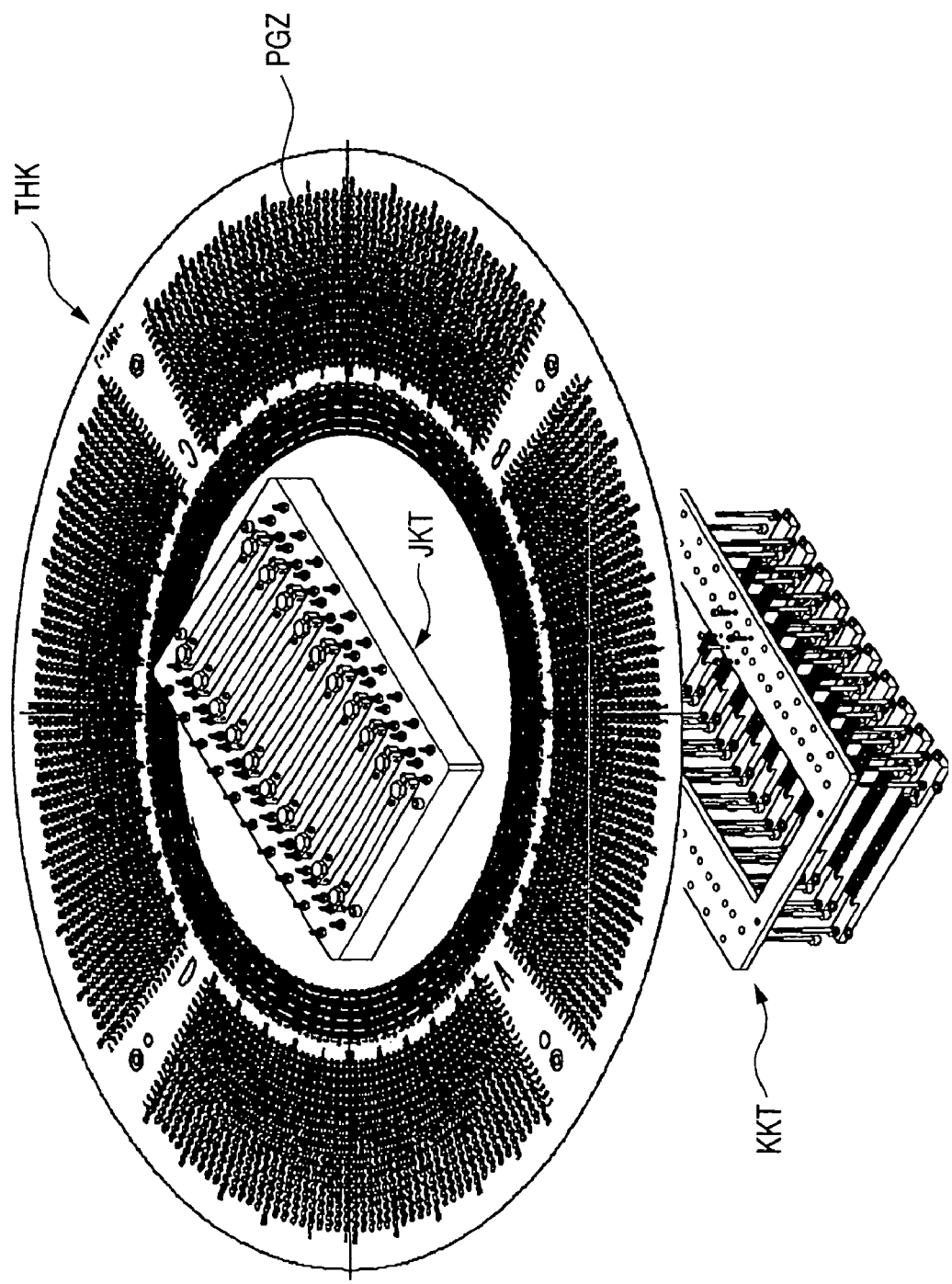
FIG. 1 is a perspective view of the structure of a probe card for probing use in the manufacturing process of a semiconductor integrated circuit device, which is Embodiment 1 of the present invention.

Before describing in detail the invention disclosed in the present application, the terminology of the application will be described below.

Wafer is a generic term for monocrystalline silicon substrate (usually having a substantially flat round shape), silicon-on-insulator (SOI) substrate, sapphire substrate, glass substrate, any other insulating, anti-insulating or semiconductive substrate and a composite substrate thereof. Any reference in this application to a semiconductor integrated circuit device may mean not only what is fabricated on a semiconductive or insulating substrate, such as a silicon wafer or a sapphire substrate, but also what is fabricated on some other insulating substrate of glass or some other material, including a thin-film transistor (TFT) or a super-twisted nematic (STN) unless expressly stated otherwise.

Device face means the main face of a wafer, the face on which a device pattern matching a plurality of chip areas is formed by lithography.

Contact terminal or probe means an object in which a wiring layer and a tip electrically connected thereto are integrally formed by a wafer process similar to the process used in fabricating a silicon wafer into a semiconductor integrated circuit, namely a patterning technique combining photolithography, chemical vapor deposition (CVD), sputtering, etching and the like.

Membrane probe, membrane probe card or protruding stylus wiring sheet composite means a membrane, 10 μm to 100 μm in thickness for instance, provided with a contact terminal (protruding stylus) to be brought into contact with the subject of testing and wiring tapped therefrom, in which electrodes for external contact are formed on that wiring.

Probe card means a structure having a contact element to come into contact with the wafer to be tested, multi-layer wiring substrate and the like, and semiconductor testing apparatus, a testing apparatus having a probe card and a sample supporting system for mounting the wafer to be tested.

Probing means an electrical examination done on a wafer having completed the wafer process by using a prober, an electrical examination of a semiconductor integrated circuit conducted by bringing the tip of the contact terminal into contact with an electrode formed over the main face of the chip area. It may be a functional test to check whether or not the chip functions as prescribed or a test to check DC operating characteristics or AC operating characteristics to distinguish between acceptable and defective products. It is differentiated from a selection test (final test) conducted after division into individual chips (or after the completion of packaging).

POGO pin or spring probe means a contact stylus having a structure to press a contact pin (plunger (contact stylus)) into contact with an electrode (terminal) by the elastic force of a spring (coil spring) and establish as required electrical connection to that electrode. It may have a configuration in which, for instance, the elastic force is transmitted to the contact pin by the spring arranged with a metal tube (holding member) via a metal ball.

Multi-area testing means simultaneous electrical testing of semiconductor integrated circuits in a plurality of chip areas, and super-multi-area testing, electrical testing of semiconductor integrated circuits in about 54 or more chip areas (about 1000 or more in the number of pins).

Stainless SUS: Special Use Stainless) steel means a corrosion-resistant metal mainly including iron (Fe) containing 12% or more of chromium (Cr), and may also contain carbon (C)), silicon (Si), manganese (Mn), phosphorus (P), sulfur (S), molybdenum (Mo), copper (Cu), nitrogen (N) and so forth besides Cr.

The following description of preferred embodiments of the invention may refer to a plurality of sections or embodiments where the convenience of description requires, but these sections or embodiments are not unrelated to one another, unless expressly stated otherwise, and one may be a variation of part or the whole of another, details, supplementary description or the like.

Where the description of the following embodiments refers to the number of elements (which may be the number of units, values, quantities, extents or the like), that specific number is nothing absolute unless expressly stated otherwise or the absoluteness of the number is obvious as a matter of principle, but the pertinent elements may be larger or smaller in number.

Further in the description of the following embodiments, their constituent elements (including elemental steps or the like) are not necessarily indispensable unless expressly stated otherwise or the indispensability of the elements is obvious as a matter of principle.

Similarly in the description of the following embodiments, any reference to the shape, positional relationship or the like of any constituent element or the like also covers what is close to or resembles that shape or the like unless expressly stated otherwise or the strictness of the reference is obvious as a matter of principle. The same applies to the values and extents referred to above.

In every drawing illustrating any of these embodiments, what has the same function as any other element is denoted by the same reference sign as that other element, and its description will not be repeated.

Further, in every drawing illustrating any of these embodiments, hatching may be used even in a plan in order to make the configuration of each member more readily understandable.

Also, in these embodiments, insulated gate field effect transistors, including metal oxide field effect transistors (MOSFETs), will be referred to as metal insulator semiconductor field effect transistors (MISFETs).

Further, regarding the detailed particulars of the membrane probe by semiconductor lithography used according to the present application, since they are disclosed in the patent applications by the present inventors and related other inventors, no repetition will be made except where repetition is necessary. These patent applications comprise Japanese Unexamined Patent Publication No. Hei 6(1994)-22885, Japanese Unexamined Patent Publication No. Hei 7(1995)-283280, Japanese Unexamined Patent Publication No. Hei 8(1996)-50146, Japanese Unexamined Patent Publication No. Hei 8(1996)-201427, Japanese Unexamined Patent Publication No. Hei 9(1997)-119107, Japanese Unexamined Patent Publication No. Hei 11(1999)-23615, Japanese Unexamined Patent Publication No. 2002-139554, Japanese Unexamined Patent Publication No. Hei 10-308423, Japanese Patent Application No. Hei 9(1997)-189660, Japanese Unexamined Patent Publication No. Hei 11(1999)-97471, Japanese Unexamined Patent Publication No. 2000-150594, Japanese Unexamined Patent Publication No. 2001-159643, Japanese Patent Application No. 2002-289377 (corresponding U.S. patent application Ser. No.: 10/676,609; U.S. application date: Oct. 2, 2003), Japanese Unexamined Patent Publication No. 2004-132699, Japanese Unexamined Patent Publication No. 2005-24377, Japanese Unexamined Patent Publication No. 2004-288672 (corresponding U.S. patent application Ser. No.: 10/765,917; U.S. application date: Jan. 29, 2004, Japanese Unexamined Patent Publication No. 2004-144742 (corresponding U.S. Patent Application No.: 2004/070,413), Japanese Unexamined Patent Publication No. 2004-157127, Japanese Unexamined Patent Publication No. 2004-144742 (corresponding U.S. Patent Application No.: 2004/070,413), Japanese Unexamined Patent Publication No. 2004-157127, Japanese Unexamined Patent Publication No. 2003-371515 (corresponding U.S. patent application Ser. No.: 10/968,215; U.S. application date: Oct. 20, 2004), Japanese Patent Application No. 2003-372323 (corresponding U.S. patent application Ser. No.: 10/968,431; U.S. application date: Oct. 20, 2004), Japanese Patent Application No. 2004-115048, PCT Application No. PCT/JP2004/17160, PCT Application No. PCT/JP2005/4344, Japanese Patent Application No. 2004-378504, and Japanese Patent Application No. 2005-1009350 (Application date: Apr. 6, 2005).

Preferred embodiments of the present invention will be described in detail with reference to the accompanying drawings.

Embodiment 1

Figure 2:
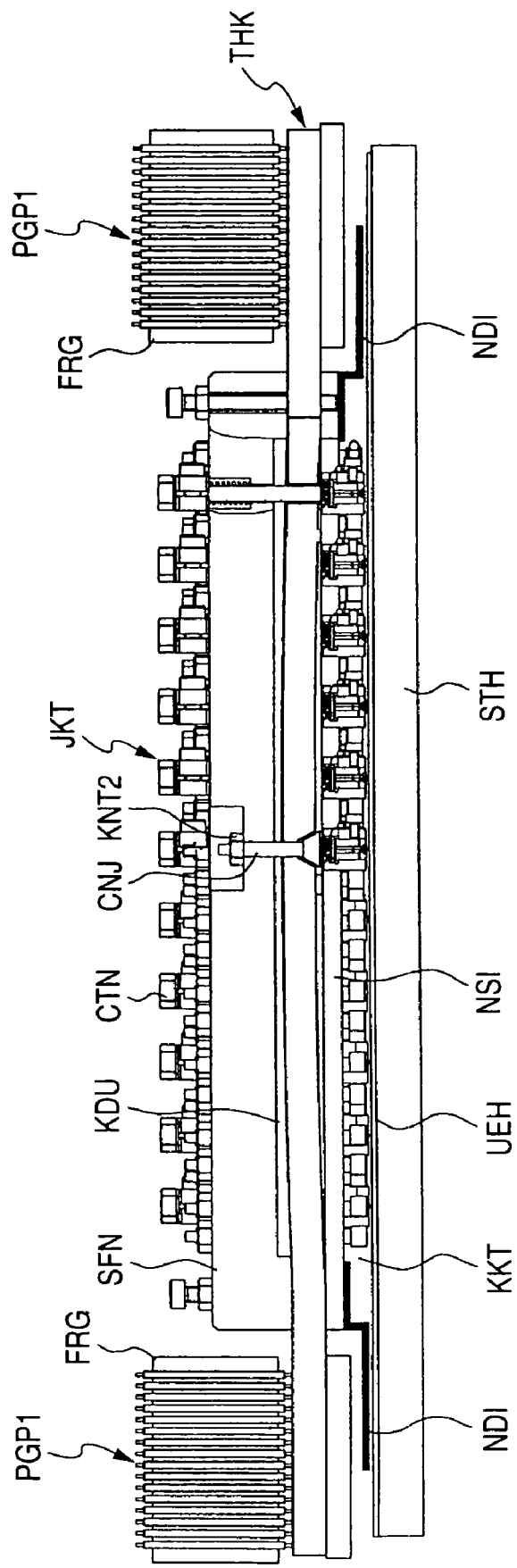
FIG. 2 is a sectional view of the essential parts of the probe card shown in FIG. 1.
Figure 3:
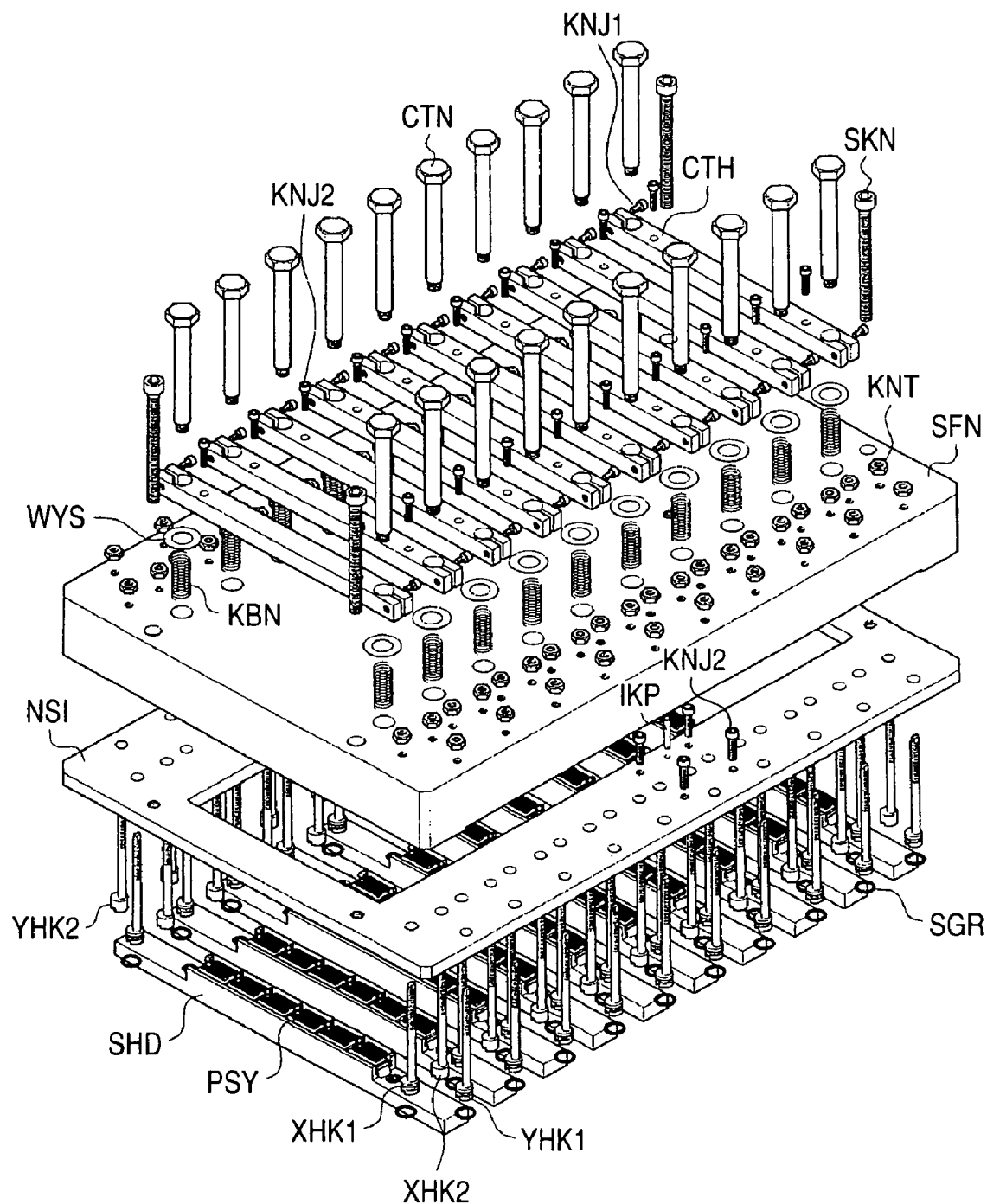
FIG. 3 is a perspective view illustrating the structure of an upper structural unit and a lower structural unit which make up part of components constituting the probe card shown in FIG. 1.
Figure 4:
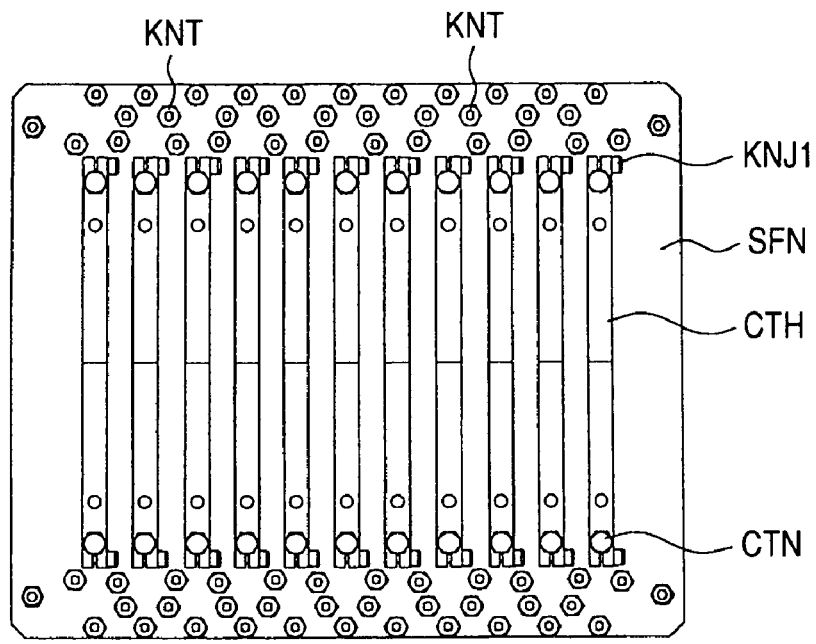
FIG. 4 is a top view of the upper structural unit shown in FIG. 3.
Figure 5:
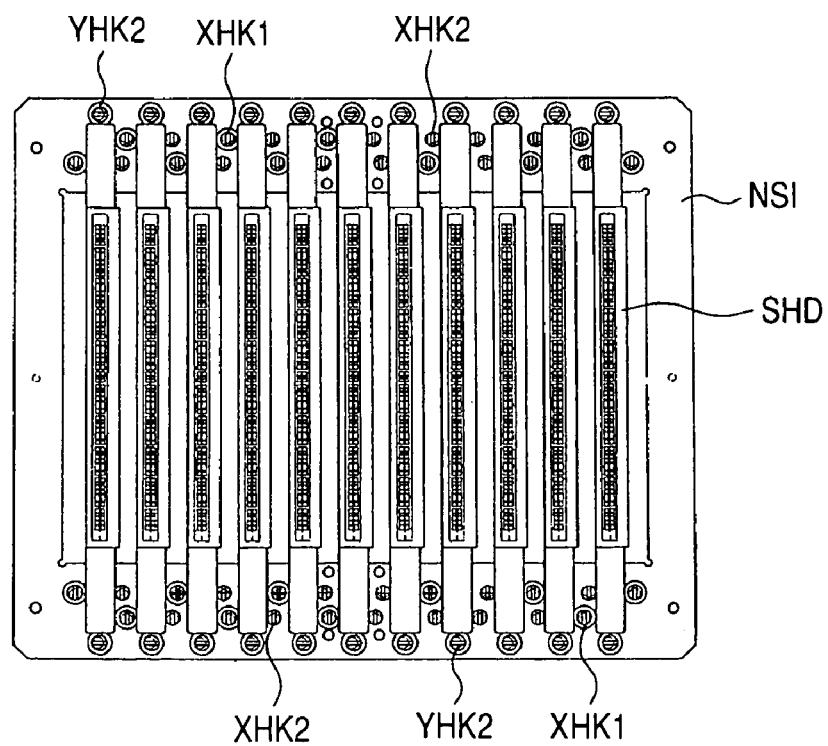
FIG. 5 is a bottom view of the lower structural unit shown in FIG. 3.

FIG. 1 is a perspective view of the structure of a probe card in this Embodiment 1. FIG. 2 is a sectional view of the essential parts of that probe card. FIG. 3 is a perspective view illustrating the structure of an upper structural unit and a lower structural unit which make up part of components constituting that probe card. FIG. 4 is a top view of that upper structural unit 3. FIG. 5 is a bottom view of that lower structural unit.

The probe card of this Embodiment 1 is composed by fitting an upper structural unit JKT from above and a lower structural unit KKT from underneath to a multi-layer wiring substrate THK. The lower structural unit KKT has a thin-film sheet (membrane probe), and a plurality of probes and a plurality of wirings each electrically connected to one or another of the plurality of probes are formed on that thin-film sheet. The plurality of wirings are electrically connected via a wiring (first wiring) formed within the multi-layer wiring substrate THK to a plurality of POGO seats PGZ disposed over the upper face of the multi-layer wiring substrate THK. These POGO seats PGZ have a function to accommodate POGO pins PGP1 which introduce signals from a tester into the probe card. Those POGO pins PGP1 are connected, in a state of being held by frog ring FRG, to the respectively matching POGO seats PGZ.

The upper structural unit is formed of a stiffener SFN, a contactor hanging holder CTH, a contactor hanging screw CTN, a stiffener fixing screw SKN, fixing screws KNJ1 and KNJ2, a coil spring KBN, a washer WSY, a fixing nut FNT and so forth. The lower structural unit is formed of a thermal coordinating plate NSI, a pusher PSY, an adhesive holder SHD, X-direction eccentric cams XHKI abd XHK2, Y-direction eccentric cams YHK1 and YHK2, a positioning pin IKP, fixing screw KNJ2, a silicon rubber ring SGR and so forth.

The stiffener SFN, formed of a highly rigid material such as stainless steel, has a function to restrain the thermal variation, warping and the like of constituent members of the probe card including the multi-layer wiring substrate THK. The bottom face used for fixing the multi-layer wiring substrate THK is flattened by grinding. Its outer circumferential part is in contact with the multi-layer wiring substrate THK, and other parts are away from the multi-layer wiring substrate THK by about 0.2 mm.

The contactor hanging holder CTH is formed of, for instance SUS303 as defined by the Japanese Industrial Standards (JIS) (containing Fe as the main component together with 0.15% or less of C, 1% or less of Si, 2% or less of Mn, 0.2% or less of P, 0.15% or less of S, 8% to 10% of Ni and 17% to 19% of Cr). Together with the contactor hanging screw CTN, it is used for hanging from and fixing at two points the adhesive holder SHD. Fixing of the contactor hanging screw CTN split-fastening by the fixing screw KNJ1 makes possible fine adjustment of the probe in the vertical direction (Z-direction).

The contactor hanging screw CTN, formed of SUS303 as defined by JIS for instance, undergoes fine adjustment in the vertical direction by split-fastening and fixing of the contactor hanging holder CTH by the fixing screw KNJ1, and fine positional adjustment of the probe in the vertical direction is thereby accomplished. When the thermal variation in the vertical direction is to be intentionally adjusted, a non-SUS303 material having a thermal expansion rate close to Si may be selected.

The stiffener fixing screw SKN, formed of SUS303 as defined by JIS for instance, is used for linking and fixing the multi-layer wiring substrate THK, the thermal coordinating plate NSI and the stiffener SFN.

The fixing screw KNJ1, formed of SUS303 as defined by JIS for instance, is used for split-fastening the contactor hanging screw CTN onto the contactor hanging holder CTH as referred to above.

The coil spring KBN is formed of stainless steel, for instance. In this Embodiment 1, the coil spring KBN is positioned in an opening bored in the stiffener SFN and between the stunner SFN and the contactor hanging holder CTH, and has a structure in which the contactor hanging screw CTN passes within the coil. When the quantity of the overdrive the probe card at the time of probing is required to be above approximately 300 μm for instance (above the set point of adjustment), the coil spring KBN has a function to lift the probe card by the probe card's own weight and the load working on the probe card and to reduce the area of the probe card riding on the wafer to be tested. Further, the action to lift the probe card by the probe card's own weight and the load working on the probe card prevents the membrane probe from being damaged by any excessive overdrive.

The washer WSY is formed of SUS303 as defined by JIS for instance.

The fixing nut FNT, formed of SUS303 as defined by JIS for instance, is used for fixing the X-direction eccentric cams XHKI abd XHK2 or the Y-direction eccentric cams YHK1 and YHK2 to the stiffener SFN and the thermal coordinating plate NSI.

The thermal coordinating plate (fixing device) NSI is formed of a material whose thermal expansion is rapidly stopped (saturated) under the temperature of probing, titanium (Ti) for instance. These thermal coordinating plate NSI, adhesive holder SHD, X-direction eccentric cams XHKI abd XHK2 and Y-direction eccentric cams YHK1 and YHK2 are fitted together integrally. Whereas the probes (contact terminals) of the thin-film sheet which the adhesive holders SHD have constitute an array on each adhesive holder SHD, the integration of the thermal coordinating plate NSI, adhesive holder SHD, X-direction eccentric cams XHKI abd XHK2 and Y-direction eccentric cams YHK1 and YHK2 serves to restrain the variation of relative coordinates between these arrays of probes due to thermal expansion. The use of the thermal coordinating plate NSI whose thermal expansion is rapidly stopped under the temperature of probing enables coordinate variation of the probes by heat to be stopped immediately.

The adhesive holders SHD adhesively hold the thin-film sheet contained in the pusher PSY to be described afterwards, a plurality of them being held side by side. At the time of probing, the adhesive holders SHD are arranged in positions near the heat source (stage heater STH) and, since the wafer UEH is to be mounted over that heat source (see FIG. 2), a material whose thermal expansion rate is close to that of the main component of the wafer UEH (for instance Si) is selected for the adhesive holders SHD (for instance Nobinite).

The X-direction eccentric cams XHKI abd XHK2 are formed of SUS303 as defined by JIS for instance. Two pairs of X-direction eccentric cams XHKI abd XHK2, so arranged as to hold each adhesive holder SHD between them, are used for fine adjustment of the position (coordinates) of the adhesive holder SHD relative to the main face of wafer UEH in one (X-direction) of the horizontal directions (hereinafter to be referred to as the XY-directions). A silicon rubber ring SGR is fitted to the X-direction eccentric cam XHKI, but no silicon rubber ring is fitted to the X-direction eccentric cam XHK2. When the quantity of the overdrive the probe card at the time of probing is required to be above approximately 300 µm for instance (above the set point of adjustment), a margin is given to the overdrive by dispensing with the silicon rubber ring SGR and thereby providing a gap.

The Y-direction eccentric cams YHK1 and YHK2 are formed of SUS303 as defined by JIS for instance. One pair of Y-direction eccentric cams YHK1 and YHK2, so arranged as to hold each adhesive holder SHD between them, are used for fine adjustment of the position (coordinates) of the adhesive holder SHD in a direction (Y-direction) orthogonal to the X-direction out of the XY-directions.

A silicon rubber ring SGR is fitted to the Y-direction eccentric cam YHK1, but no silicon rubber ring, but no silicon rubber ring is fitted to the Y-direction eccentric cam YHK2. When the quantity of the overdrive the probe card at the time of probing is required to be above approximately 300 µm for instance (above the set point of adjustment), a margin is given to the overdrive by dispensing with the silicon rubber ring SGR and thereby providing a gap.

The positioning pin IKP is formed of SUS303 as defined by JIS for instance and, together with the fixing screw KNJ2, positions and fixes near the center of the multi-layer wiring substrate THK the thermal coordinating plate NSI. This makes it possible to uniformize the thermal expansion (coordinate variations) of the multi-layer wiring substrate THK over the whole area as the thermal expansion of the multi-layer wiring substrate THK is caused to proceed from the center toward the outer circumference.

The fixing screw KNJ2 is formed of SUS303 as defined by JIS for instance and, together with the positioning pin IKP, positions and fixes near the center of the multi-layer wiring substrate THK the thermal coordinating plate NSI.

The pusher PSY will be described in detail after wards.

At the time of probing, when the stage heater STH mounted with the wafer UEH to be tested and the probe card approach, heat conduction from the stage heater STH causes deformations such as warping and elongation to each of the members constituting the probe card in the XY-direction and in the vertical direction (Z-direction) relative to the surface of the wafer UEH, resulting in coordinate variations of the probe.

Then, in this Embodiment 1, first to address the deformations in the Z-direction of the members constituting the probe card, a screw CNJ is fitted at the center of the multi-layer wiring substrate THK, and, after fitting this screw CNJ into the stiffener SFN, the screw CNJ is tightened up with the fixing nut FNT 2 (see FIG. 2). This tightening of the screw CNJ with the fixing nut FNT 2 warps the multi-layer wiring substrate THK upward, namely toward the other side than where the wafer UEH is arranged, to a prescribed extent. An example of extent of this warping of the multi-layer wiring substrate THK can be a few tens of µm. The coordinate variations in the Z-direction can be thereby mono-directionalized. Also, the presence of a hollow KDU between the stiffener SFN and the multi-layer wiring substrate THK can serve to prevent the stiffener SFN from being pushed and deformed by the warp of the multi-layer wiring substrate THK.

Also, in this Embodiment 1, variations of relative coordinates among the arrays of probes for each adhesive holder SHD due to thermal expansion are restrained by forming the thermal coordinating plate NSI is of a material whose thermal expansion is rapidly stopped (saturated) under the temperature of probing as stated above. In addition to that, this Embodiment 1 has a configuration in which heat from the stage heater STH is promptly transferred to the thermal coordinating plate NSI at the time of probing by fitting a heat conducting plate NDI having a high heat conduction rate on the outer circumferential part of the bottom face of the thermal coordinating plate NSI opposite the wafer UEH. In this Embodiment 1, examples of material that can be cited for this heat conducting plate NDI include copper and aluminum. This configuration enables the thermal expansion of the thermal coordinating plate NSI to be even more rapidly stopped (saturated) under the temperature of probing.

Figure 6:
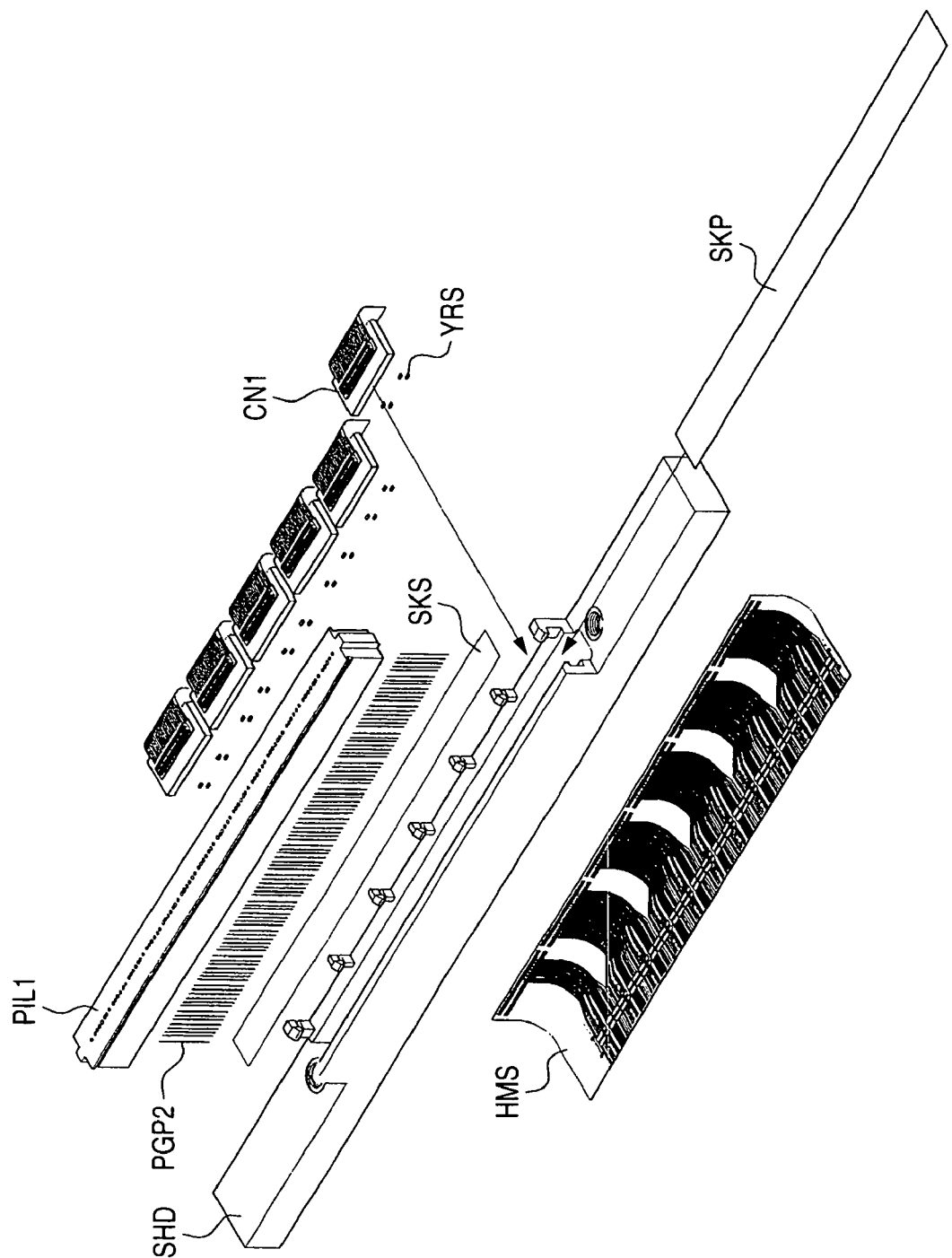
FIG. 6 is a perspective view illustrating the structure of a pusher included in the lower structural unit shown in FIG. 3.

FIG. 6 is a perspective view illustrating the structure of the pusher PSY included in the lower structural unit KKT (see FIG. 3). In FIG. 6, the adhesive holder (sea holding device) SHD (see also FIG. 3) holding the pusher PSY Y is also illustrated.

As shown in FIG. 6, the pusher PSY in this Embodiment 1 is formed of, for instance, a POGO pin insulator PIL1, a POGO pin (pressing mechanism) PGP2, an FPC connector (third wiring) CN1, a membrane probe (first sheet) HMS, an impact easing sheet SKS, an impact easing plate SKP, a chip condenser YRS and so forth.

The POGO pin insulator PIL1 is formed of a material permitting highly accurate hole boring, for instance polyetherimide (PE1) or an equivalent of PE1. Further, the POGO pin insulator PIL1 has a plurality of holes to guide the POGO pins PGP2, and these holes are bored in such positions as uniformize the load per probe.

Each of the POGO pins PGP2 applies a prescribed load by the elasticity of the spring built into it upon the matching probe. Detailed description of the POGO pins PGP2 will be made afterwards.

Each of the FPC connectors CN1 has a structure in which a flexible print wiring cable (FPC) is provided with a terminal for electrical connection to the membrane probe HMS, and relays electrical connection from the membrane probe HMS to the multi-layer wiring substrate THK.

The membrane probe HMS is formed of a membrane whose main component is, for instance, polyimide. Since such a membrane probe HMS is flexible, this Embodiment 1 is so structured, in order to bring every probe into contact with the pad of the chip (semiconductor integrated circuit device), that the POGO pins PGP2 press from above (the rear face) the membrane probes HMS in the area where the probes are formed. Thus, the elastic forces of the springs arranged within the POGO pins PGP2 apply a certain pressure onto the membrane probes HMS. Further, each membrane probe HMS held by one adhesive holder SJD has probes matching a plurality of chip areas. Since one membrane probe HMS is fitted to each adhesive holder SHD in this Embodiment 1, when replacement of any membrane probe HMS is necessitated by damage to or some other trouble with a probe, only the affected membrane probe HMS needs to be replaced. This contributes to reducing the time taken to replace the membrane probe HMS. Moreover, since only the affected membrane probe HMS has to be replaced, the cost of the membrane probes HMS can be saved, too.

An impact easing sheet SKS is formed of a resilient silicon rubber sheet for instance. By arranging this impact easing sheet SKS over the membrane probe HMS, stresses working on the membrane probe HMS can be eased and the falling of foreign matter onto the wafer UEH to be tested can be prevented.

An impact easing plate SKP is formed of, for instance, flame retardant type 4 (FR4), which is a flame retardant printed board material including a composite of glass fibers and epoxy resin or an equivalent flame retardant material. This impact easing plate SKP is arranged, after the POGO pin insulator PILL holding the POGO pins PGP2 is incorporated into each adhesive holder SHD, over the POGO pin insulator PIL1 (on the other side than where the membrane probe HMS is arranged) and receives the load reaction force of the POGO pins PGP2.

Figure 7:
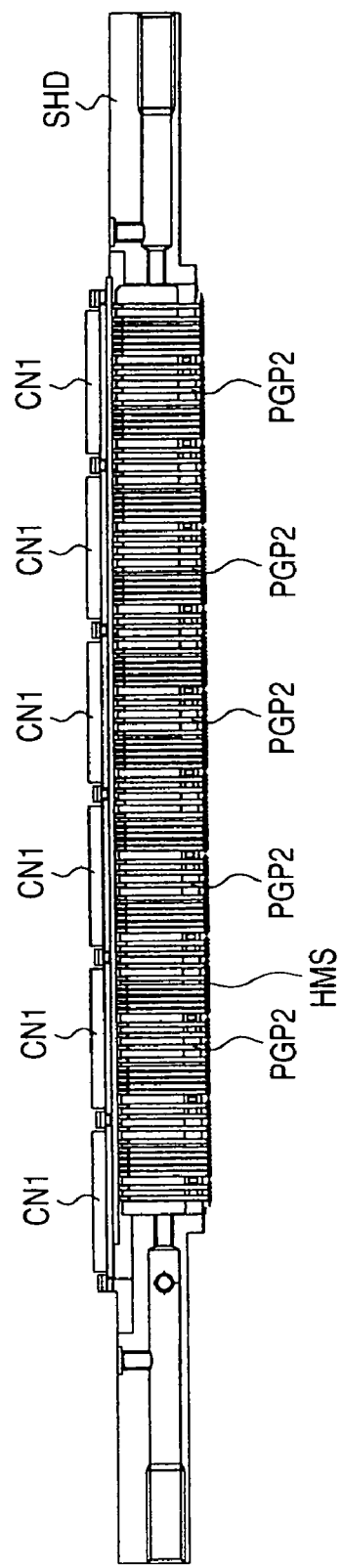
FIG. 7 is a sectional view of the essential parts of the components constituting the probe card shown in FIG. 1.
Figure 8:
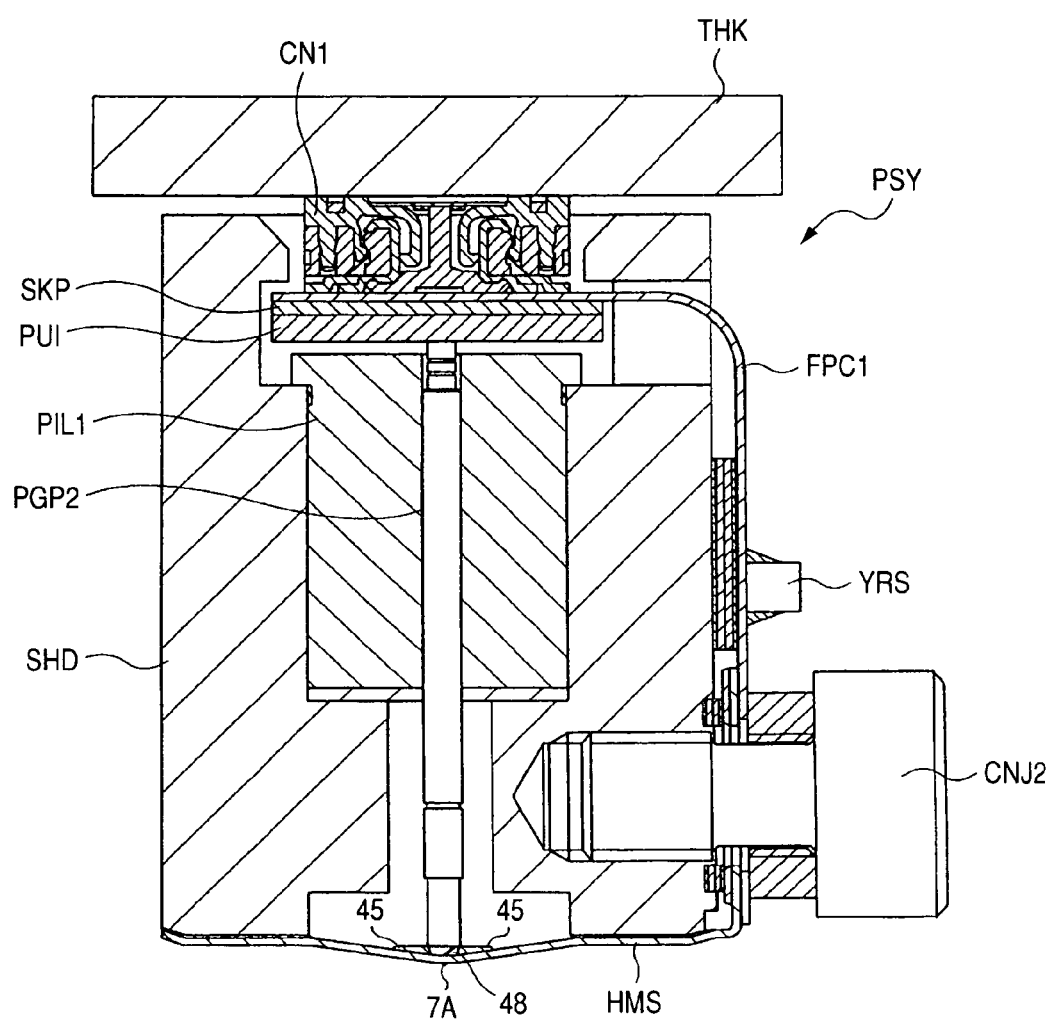
FIG. 8 is a sectional view of the essential parts of the components constituting the probe card shown in FIG. 1.

FIG. 7 is a sectional view, in a state in which the POGO pin insulator PIL1 holding the POGO pins PGP2 is incorporated into each adhesive holder SHD, of these structural elements, and FIG. 8, a sectional view of those structural elements in the direction normal to the drawing surface of FIG. 7.

The POGO pin insulator PIL1 holding the POGO pins PGP2 is incorporated into the adhesive holder SHD and, after being aligned together with the membrane probe HMS and the flexible print wiring cable (third wiring) FPC1 included in the FPC connector CN1, is fixed to the adhesive holder SHD with a screw CNJ2. Or, after being aligned on the bottom face of the adhesive holder SHD, it is adhered with an epoxy adhesive, and electrically connected to the flexible print wiring cable FPC1 with the screw CNJ 2 on one side of the adhesive holder SHD. The various wirings (including the wiring and formed within the membrane probe HMS and the flexible print wiring cable FPC1) electrically connected to the plurality of probes (contact terminals) 7A formed in the membrane probe HMS are thereby tapped in one direction, namely to one side of the adhesive holder SHD, and electrically connected to the wiring formed in the multi-layer wiring substrate THK. As a result, the length of the wiring electrically connecting probes 7A and the multi-layer wiring substrate THK can be shortened. In this Embodiment 1, the total current path combining the wiring from the probes 7A formed in the membrane probe HMS and the wiring in the flexible print wiring cable FPC1 tapped to the upper face of the adhesive holder SHD can be reduced to about 16 mm. As the resistances of those wirings can be correspondingly reduced, the noise arising on those wirings can also be suppressed.

Further a chip condenser YRS is fitted to the flexible print wiring cable FPC1 as a bypass condenser. In this Embodiment 1, the position of fitting this chip condenser YRS may be, for instance, where the length of the current path from the probes 7A is about 8 mm. Whereas noise is more apart to arise where the distances to the probes 7A are shorter over the whole current path from the probes 7A to the tester which transmits and receives test signals, the chip condenser YRS is fitted as close as practicable to the probes 7A in this Embodiment 1. Further in this Embodiment 1, two layers of wiring are formed in the flexible print wiring cable FPC1 and wirings related to power supply and grounding are disposed, for instance, on the other side than where the probes 7A are formed. This makes it possible to secure sufficient widths for the wirings related to power supply and grounding, on which larger currents flow than elsewhere and which are smaller in number than other wirings related to signal inputs and outputs. It is also possible to secure as great widths as practicable for other wirings related to signal inputs and outputs. In this Embodiment 1, other wirings related to signal inputs and outputs are equalized in length wherever practicable. These features make it possible to achieve satisfactory current and noise characteristics on the flexible print wiring cable FPC1.

In the membrane probe HMS, metal films 45, made of 42 alloy for instance, are so arranged as to hold between them an elastomer 48 formed over the probes 7A. In this state, the POGO pins PGP2 are pressing the elastomer 48. Incidentally, it is also acceptable to dispense with the elastomer 48 and instead use a structure the distance between the metal films 45 is so set as not to let the POGO pins PGP2 come into contact with the membrane probe HMS and have the POGO pins PGP2 apply pressure between those metal films 45.

Between the impact easing plate SKP and the POGO pin PGP2, there is arranged a thin OGO pin receiving plate PUI, formed of SUS303 as defined by JIS for instance. Arrangement of this POGO pin receiving plate PUI, coupled with the easing of the load reaction of the POGO pins PGP2 by the impact easing plate SKP, can ease the load reaction of the POGO pin PGP2 even more effectively.

Figure 9:
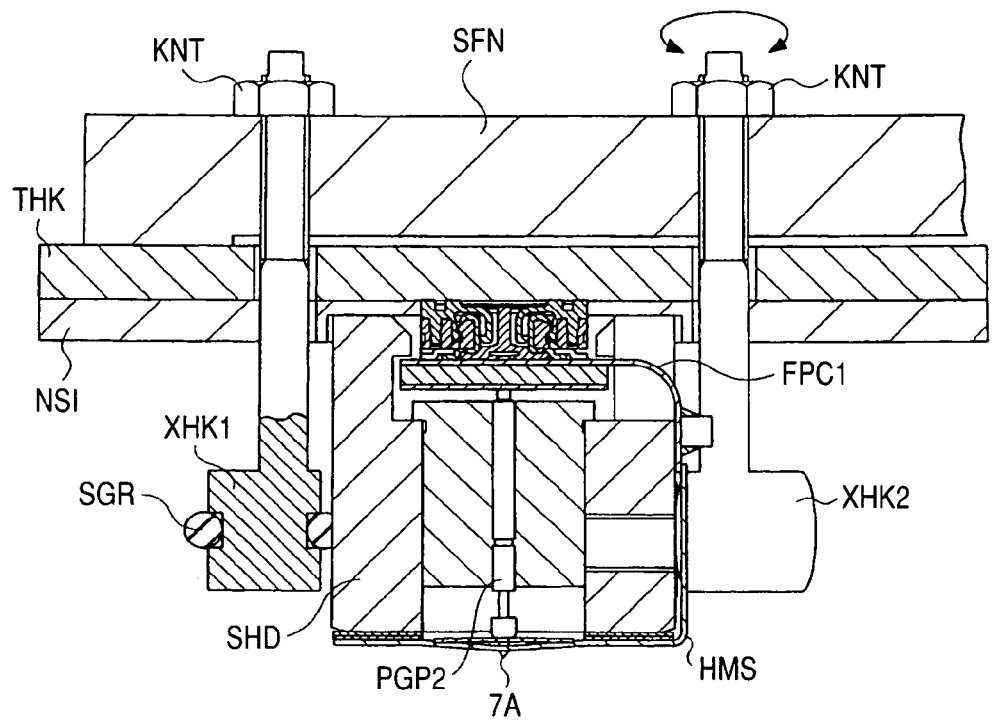
FIG. 9 is a sectional view of the essential parts in a state in which the upper structural unit and the lower structural unit which make up part of components constituting the probe card shown in FIG. 1 are fitted to a multi-layer wiring substrate.
Figure 10:
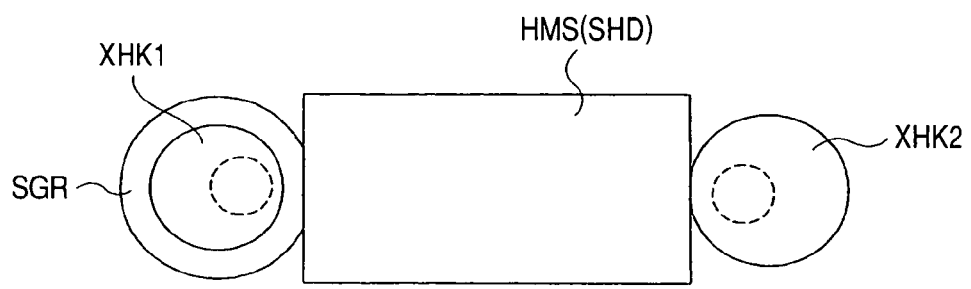
FIG. 10 is a plan showing the essential parts of the bottom face of an adhesive holder in a state in which the upper structural unit and the lower structural unit which make up part of components constituting the probe card shown in FIG. 1 are fitted to the multi-layer wiring substrate.

FIG. 9 is a sectional view of the essential parts of the probe card, which is Embodiment 1, in a state in which the upper structural unit and the lower structural unit are fitted to the multi-layer wiring substrate THK, and FIG. 10, a plan showing the essential parts of the bottom face of the adhesive holder in that state.

As shown in FIG. 9 and FIG. 10, the adhesive holder SHD is so held on its sides by the X-direction eccentric cams XHKI abd XHK2 as to be squeezed between them. Further, though not shown in FIG. 9 and FIG. 10, the Y-direction eccentric cams YHK1 and YHK2 also hold the adhesive holder SHD on its sides so as to squeeze the adhesive holder SHD between them. As stated above, the silicon rubber ring SGR is fitted to the X-direction eccentric cam XHK1, but no silicon rubber ring SGR is fitted to the X-direction eccentric cam XHK2. For fine adjustment of the position of the adhesive holder SHD in the X-direction, after fixing the X-direction eccentric cam XHK1 by fastening its fixing nut FNT, the X-direction eccentric cam XHK2 is turned and, when the adhesive holder SHD has come to its desired position, the X-direction eccentric cam XHK2 is fixed by fastening its fixing nut FNT. Then, the silicon rubber ring SGR absorbs the superfluous reaction force that works on the adhesive holder SHD when the X-direction eccentric cam XHK2 is turned. There is a similar mechanism for the Y-direction eccentric cams YHK1 and YHK2 to that for the X-direction eccentric cams XHKI and XHK2, and the method of fine adjustment of the position of the adhesive holder SHD in the Y-direction is the same as that by the X-direction eccentric cams XHK1 and XHK2 in the X-direction.

Figure 11:
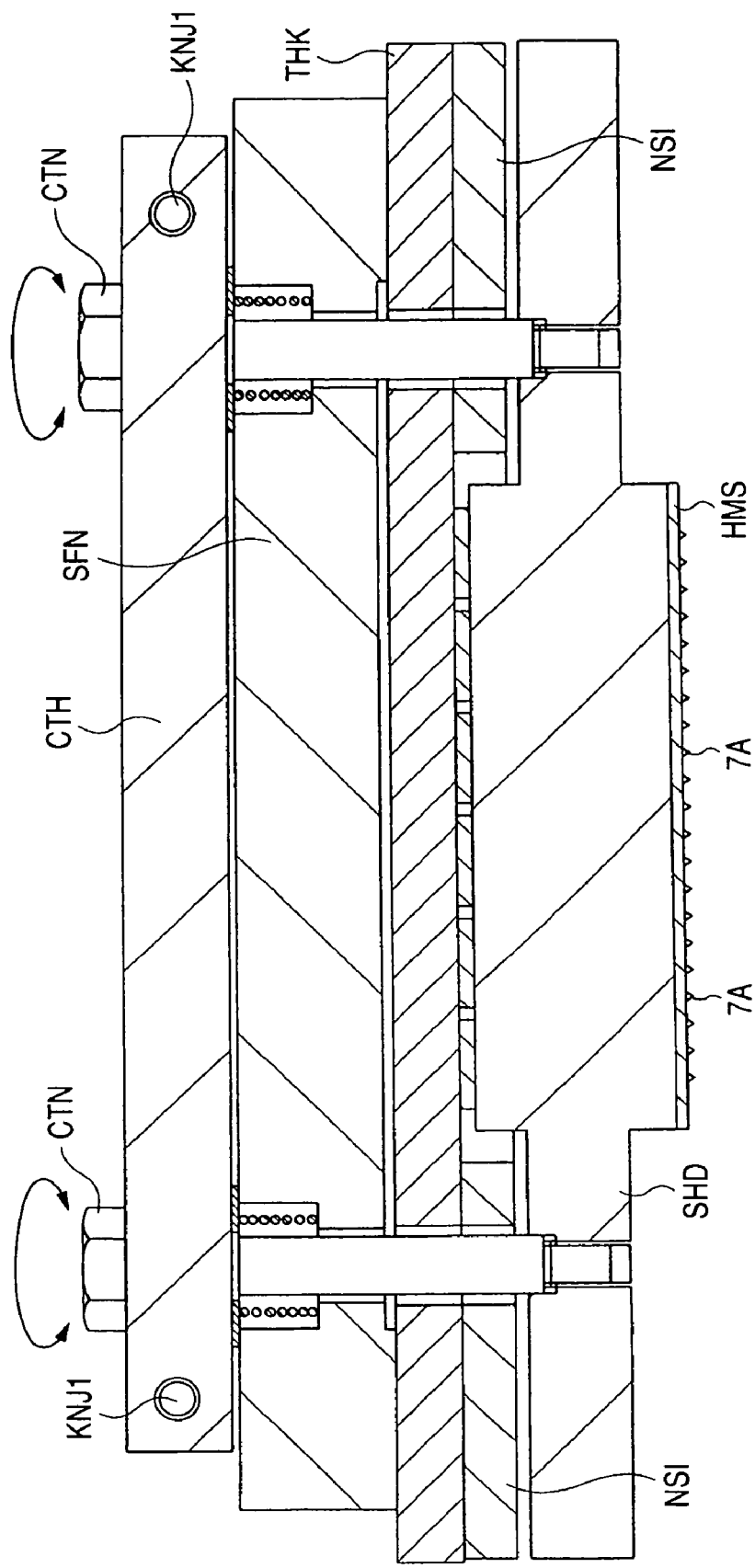
FIG. 11 is a sectional view of the essential parts of the probe card shown in FIG. 1 in a state in which the upper structural unit and the lower structural unit which make up part of components constituting the probe card are fitted to the multi-layer wiring substrate.

FIG. 11 is a sectional view of the essential parts of the probe card, which is Embodiment 1, in a state in which the upper structural unit and the lower structural unit are fitted to the multi-layer wiring substrate THK.

In this Embodiment 1, fine adjustment of the position of the adhesive holder in the vertical direction (Z-direction) is accomplished by turning the contactor hanging screw CTN, and by fastening the fixing screw KNJ1 after the completion of that find adjustment, the contactor hanging screw CTN is split-fastened and fixed to the adhesive holder SHD. Fine adjustment of the position of the probes 7A in the Z-direction can be thereby accomplished as described above with reference to FIG. 1 through FIG. 5.

Figure 12:
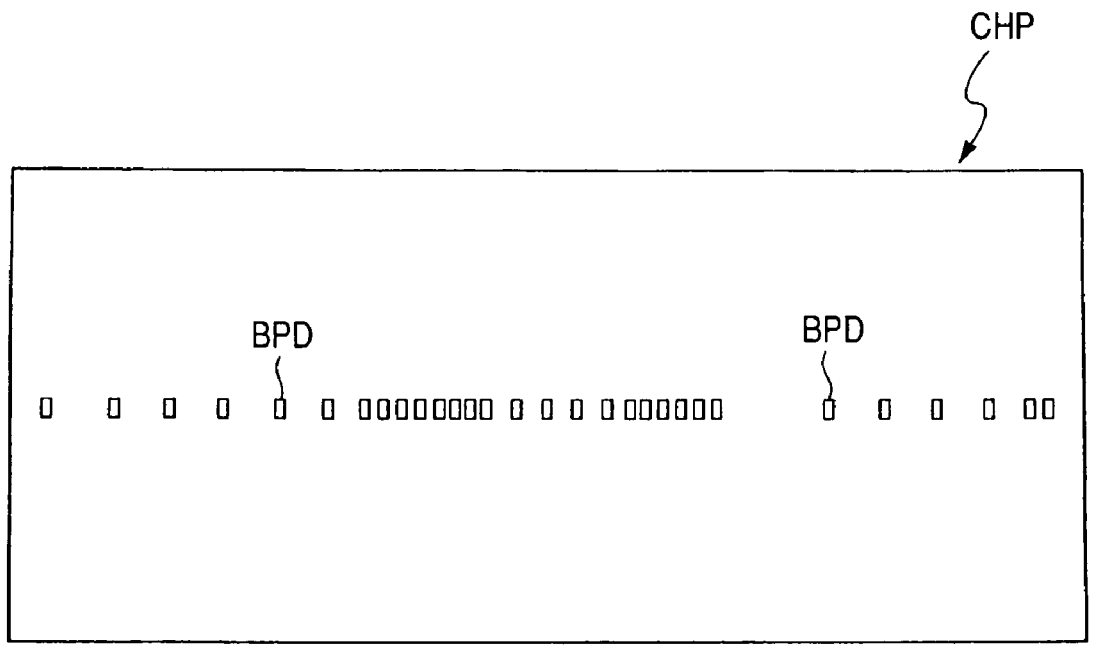
FIG. 12 is a plan of a chip which is one example of the semiconductor integrated circuit device, which is Embodiment 1 of the invention.

The probe card of this Embodiment 1 is used for, for instance, probing during the manufacturing process of AND type flash memories (semiconductor integrated circuits), which constitute one example of nonvolatile memories including electric erasable programmable read only memories (EEPROM; hereinafter referred to as flash memories). FIG. 12 is a plan showing a chip layout of that AND type flash memory, and FIG. 13, a plan showing a layout of the membrane probe HMS matching the chip of that AND type flash memory.

As shown in FIG. 12, the chip (chip area) CHP of the AND type flash memory is a flat rectangular chip having long and short sides, and over its surface there are arranged substantially along the center line bonding pads (first electrodes) BPD, which constitute input/output terminals to be in parallel to the long sides. By connecting bonding wires, including gold (Au) or the like for instance, to these bonding pads BPD, the chip CHP is mounted over a packaging substrate.

Figure 13:
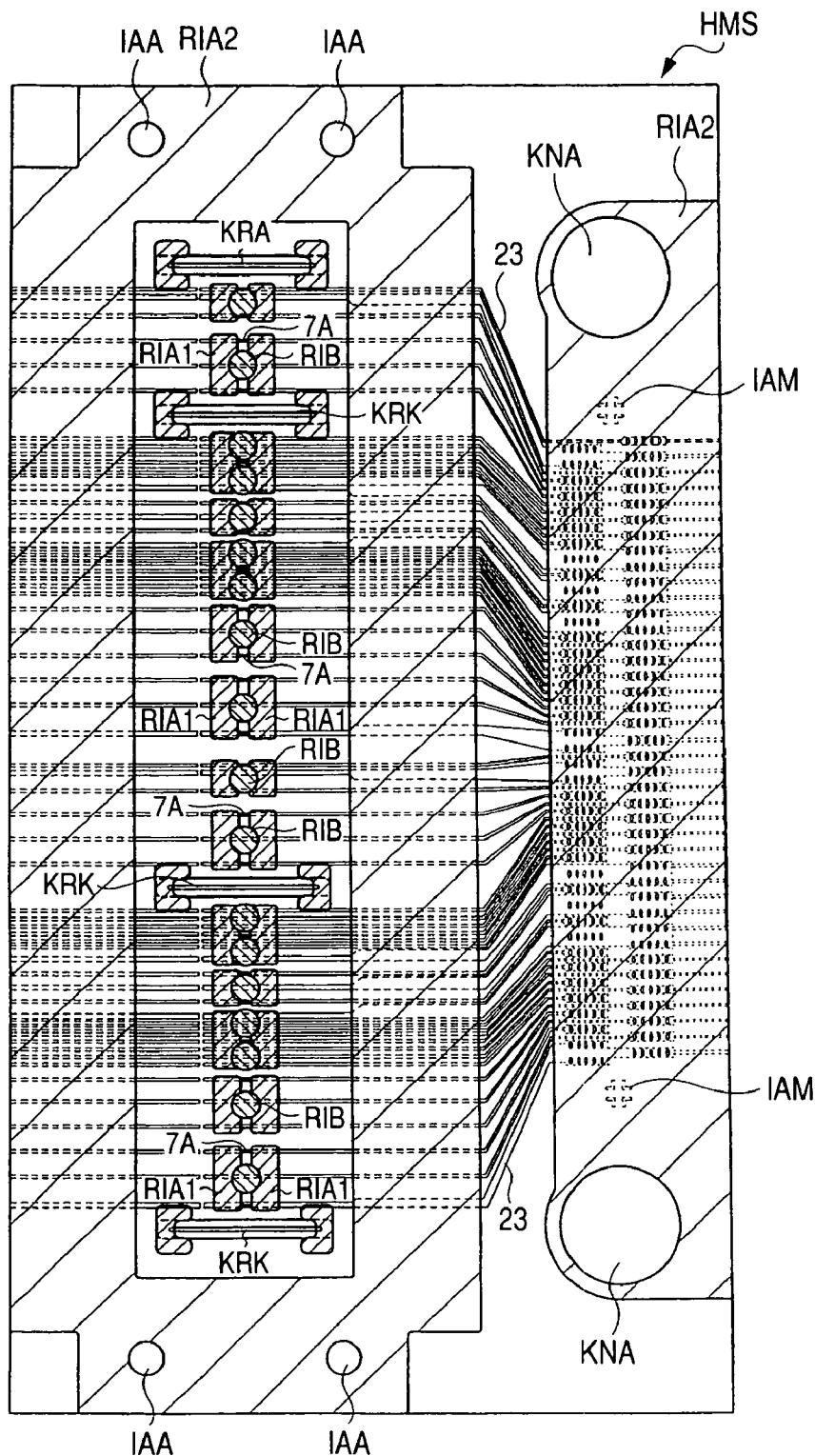
FIG. 13 is a plan showing the layout of a membrane probe matching the chip shown in FIG. 12.

The membrane probe HMS shown in FIG. 13 matches two chips CHP, but the membrane probe HMS may as well be so laid out as to match more than two chips CHP. In FIG. 13, areas RIA1 and RIA2 hatched with 45° lines are areas where the metal films 45 are arranged, and areas hatched with 135° lines are areas where the POGO pins PGP2 come into contact with.

The areas RIA1 are so arranged in the areas of the membrane probe HMS matching the chips CHP as to be in parallel to the long sides of the chips CHP, and each pair of areas RIA1 so arranged in an island shape to hold a probe 7A between them. To one of these island-shaped paired areas (first areas) RIA1, one or two areas RIB are arranged. Thus, one or two POGO pins PGP2 are pressed against the paired metal films 45 arranged in an island shape. In areas (second areas) opposite areas RIA1 on the main face of the chips CHP, each of bonding pads BPD opposes the matching one of the probes 7A. In this Embodiment 1, about three to eight probes 7A are arranged underneath the paired metal films 45, so that one POGO pin PGP2 presses about three or four probes. In the areas of the membrane probe HMS matching the chips CHP, one or more cuts KRK are so provided to be substantially in parallel to the direction in which a wiring (second wiring) 23 electrically connected to the probes 7A formed in the membrane probe HMS extends. This makes it possible, even if there are differences in height among the plurality of the bonding pads BPD, to enhance the compliance of the respectively matching probes 7A to those height differences to make possible suitable pressure control over all the probes 7A. As a result, it is made possible to prevent depressions, which are left in the bonding pads BPD after the probes 7A are brought into contact with the bonding pads BPD at the time of probing, from becoming uneven in distinctiveness. This prevention of uneven distinctiveness of the depressions can prevent the probes 7A from being crushed or otherwise damaged, and achieve suitable pressure control over all the probes 7A.

Further, the membrane probe HMS is provided with fixed screw holes KNA, alignment holes IAA and alignment marks IAM. The fixed screw holes KNA are used for letting the screws CNJ2 for pressure-fitting the membrane probe HMS and the flexible print wiring cable FPC1 pass. The alignment holes IAA are used as alignment pin holes for highly accurately aligning the relative positions of the membrane probe HMS and the adhesive holder SHD. The alignment marks IAM are used for highly accurately aligning the joining positions of the membrane probe HMS and of the flexible print wiring cable FPC1.

Figure 14:
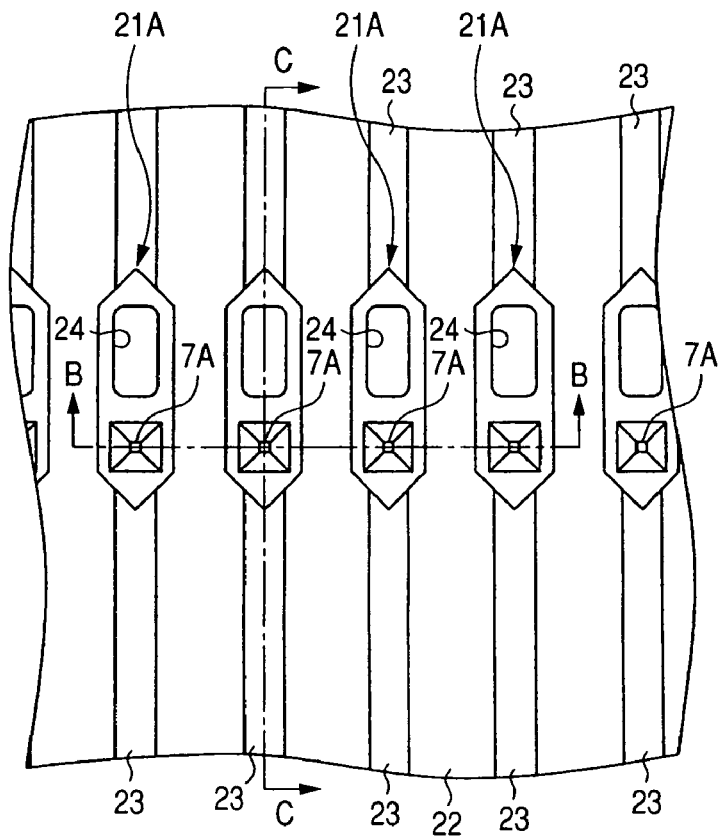
FIG. 14 is a plan of essential parts showing an enlarged view of part of the membrane probe shown in FIG. 13.
Figure 15:
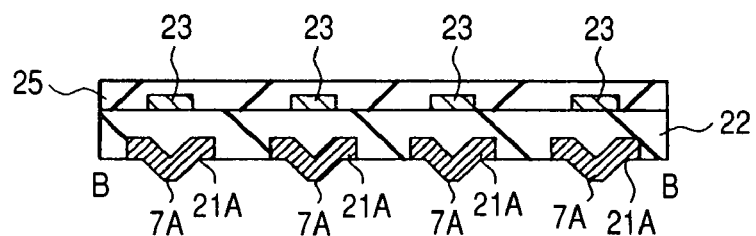
FIG. 15 is a sectional view of essential parts along line B-B in FIG. 14.
Figure 16:
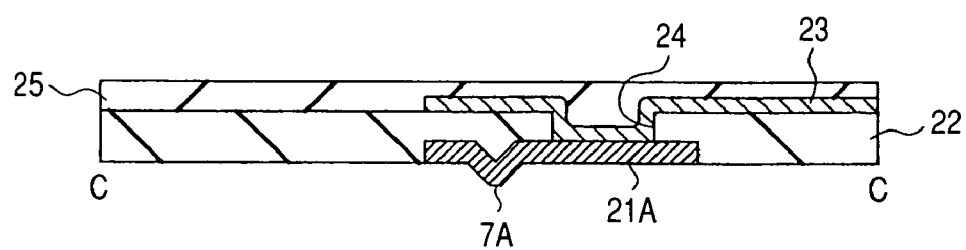
FIG. 16 is a sectional view of essential parts along line C-C in FIG. 14.

FIG. 14 is a plan of essential parts showing an enlarged view of part of the lower face of the membrane probe HMS where the probes 7A are formed; FIG. 15 is a sectional view of essential parts along line B-B in FIG. 14; and FIG. 16 is a sectional view of essential parts along line C-C in FIG. 14.

Figure 17:
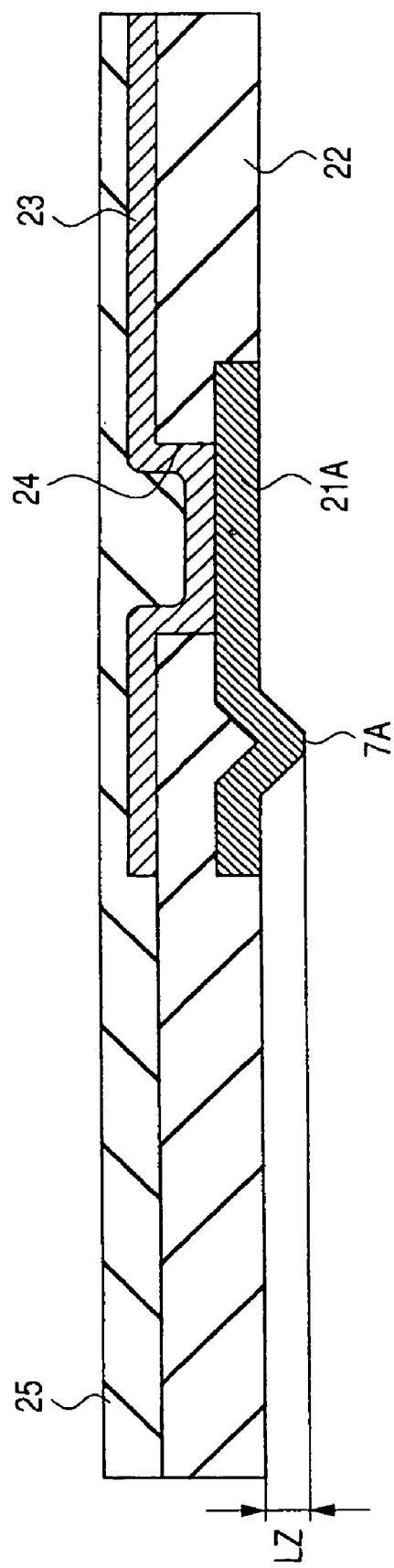
FIG. 17 is a sectional view of essential parts showing an enlarged view of part of the membrane probe shown in FIG. 13.

The probes 7A constitute part of flat metal films 21A hexagonally patterned in the membrane probe HMS, portions protruding in a quadrangular pyramidal shape or a quadrangular prismoidal shape from the lower face of the membrane probe HMS out of the metal films 21A. The probes 7A are arranged, aligned with the positions of the bonding pads BPD formed over the chips CHP, over the main face of the membrane probe HMS. Further, as shown in FIG. 17, it is desirable for the height LZ (stylus height) from the surface of a polyimide film 22 constituting the membrane probe HMS to the tips of the probes 7A to be uniformly 50 μm or less (at most 90 μm or less), or more desirably 30 μm or less.

Each of the metal films 21A is formed by successively stacking, for instance, a rhodium film and a nickel from the bottom layer. The polyimide film 22 is formed over the metal film 21A, and a wiring 23 (see also FIG. 13) electrically connected to each of the metal films 21A is formed over the polyimide film 22. The wiring 23 is in contact with the metal films 21A at the bottom of through holes 24 bored in the polyimide film 22. Over the polyimide film 22 and the wiring 23, another polyimide film 25 is formed.

Next, the structure of the membrane probe HMS of Embodiment 1 described above, together with its manufacturing process, will be described with reference to FIG. 18 through FIG. 25.

Figure 18:
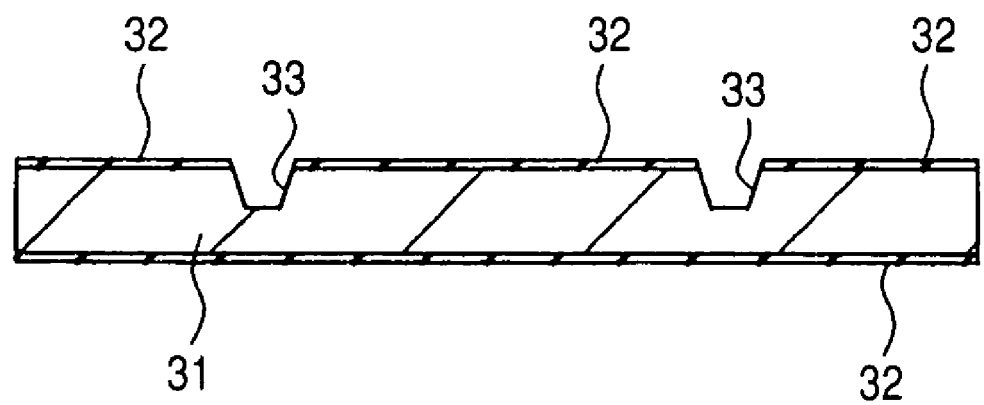
FIG. 18 is a sectional view of essential parts illustrating the fabricating process of the membrane probe shown in FIG. 13.

First, a wafer (first substrate) 31 including silicon having a thickness of about 0.2 mm to 0.6 mm is made ready as shown in FIG. 18, and silicon oxide films 32 of about 0.5 μm in thickness are formed on the two faces of this wafer 31 by thermal oxidation. Then, the silicon oxide film 32 on the main face side of the wafer 31 is etched with a photoresist film used as the mask and an opening reaching the wafer 31 is bored into the silicon oxide film 32 on the main face side of the wafer 31. Next, with the remaining silicon oxide film 32 used as the mask, a quadrangular pyramidal shaped or quadrangular prismoidal shaped hole (first hole) 33 surrounded by a face (111) is formed in the main face of the wafer 31 by anisotropically etching the wafer 31 with a strong alkali aqueous solution (for instance an aqueous solution of potassium hydroxide).

Figure 19:
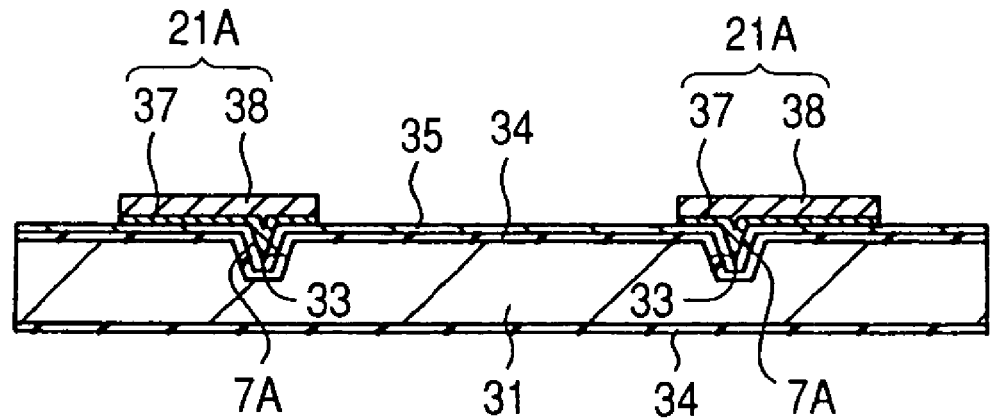
FIG. 19 is a sectional view of essential parts during the fabricating process of the membrane probe following FIG. 18.

Next, as shown in FIG. 19, etching the silicon oxide film 32 used as the mask when the hole 33 was bored is removed by wet etching with a mixture of hydrofluoric acid and ammonium fluoride. Then, by subjecting the wafer 31 to thermal oxidation, a silicon oxide film 34 of about 0.5 µm in thickness is formed all over the wafer 31 including the inside of the hole 33. Next an electroconductive film (first metal film) 35 is formed over the main face of the wafer 31 including the inside of the hole 33. This electroconductive film 35 can be formed by stacking, for instance, a chromium film of about 0.1 µm in thickness and a copper film of about 1 µm in thickness by successive sputtering or vapor deposition. Then, a photoresist film is formed over the electroconductive film 35, and the photoresist film is removed from the area where the metal films 21A (see FIG. 15 through FIG. 17) are to be formed at a subsequent step by photolithography, where an opening is formed.

Next, an electroconductive film (first metal film) 37 and an electroconductive film (first metal film) 38, both of high hardness, are successively stacked by electrolytic plating, using the electroconductive film 35 as the electrode, over the electroconductive film 35 emerging at the bottom of the opening in the photoresist film. In this Embodiment 1, for instance, rhodium can be used as the material for the electroconductive film 37 and nickel, for the electroconductive film 38. By the steps so far described, the metal films 21A can be formed from the electroconductive films 37 and 38. Further, the electroconductive film 37 in the hole 33 constitutes the probes 7A. Whereas the electroconductive film 35 is removed at a subsequent step, that step will be described afterwards.

In the metal films 21A, when the probes 7A are formed at a subsequent step, the electroconductive film 37 formed of rhodium constitute the upper surface, and the electroconductive film 37 will come into direct contact with the bonding pad BPD. For this reason, it is preferable for the electroconductive film 37 to be made of a hard and wear-resistant material. Further, as the electroconductive film 37 comes into direct contact with the bonding pad BPD, if dust of the bonding pad BPD shaved off by the probes 7A sticks to the electroconductive film 37, a cleaning step to remove that dust will be needed, and this might elongate the probing process. Therefore, it is preferable to select for the electroconductive film 37 a material to which the material of the bonding pad BPD would not stick easily. Accordingly in this Embodiment 1, a rhodium film which meets these conditions is selected for the electroconductive film 37. This choice makes it possible to dispense with the cleaning step.

Figure 20:
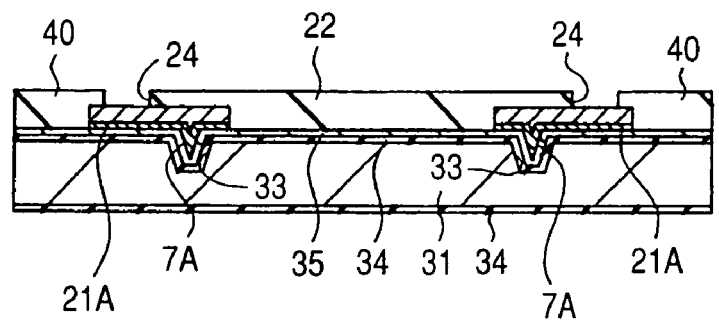
FIG. 20 is a sectional view of essential parts during the fabricating process of the membrane probe following FIG. 19.

Next, after the photoresist film used for the formation of the metal films 21A (the electroconductive films 37 and 38) is removed, the polyimide film (first polyimide film) 22 (also see FIG. 15 through FIG. 17) is so formed as to cover the metal films 21A and electroconductive film 35 as shown in FIG. 20. Then, the through holes (first openings) 24 are bored in that polyimide film 22 deep enough to reach the metal films 21A. These through holes 24 can be formed by boring by the use of laser or dry etching with an aluminum film used as the mask.

Figure 21:
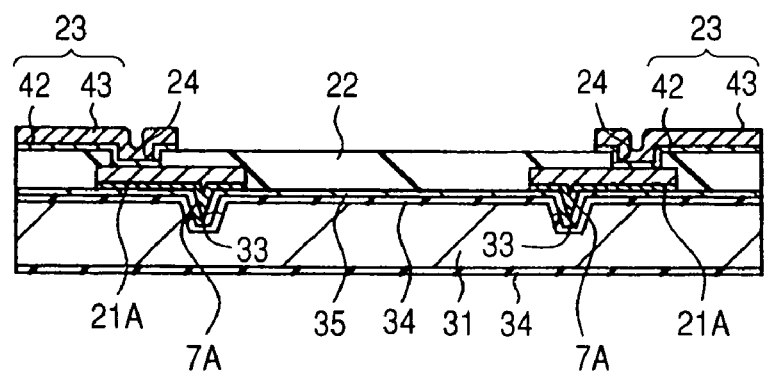
FIG. 21 is a sectional view of essential parts during the fabricating process of the membrane probe following FIG. 20.

Next, as shown in FIG. 21, an electroconductive film (second metal film) 42 is formed over the polyimide film 22 including the inside of the through holes 24. This electroconductive film 42 can be formed by stacking, for instance, a chromium film of about 0.1 µm in thickness and a copper film of about 1 µm in thickness by successive sputtering or vapor deposition. Then, after forming a photoresist film over the electroconductive film 42, that photoresist film is patterned by photolithography, and an opening deep enough to reach the electroconductive film 42 is bored in the photoresist film. Next, an electroconductive film (second metal film) 43 is formed by plating over the electroconductive film 42 in that opening. In this Embodiment 1, a copper film or a laminate film in which a copper film and a nickel film are successively stacked from the bottom layer, for example, can be used as the electroconductive film 43.

Next, after removing the photoresist film, a wiring 23 including the electroconductive films 42 and 43 is formed by etching the electroconductive film 42 with the electroconductive film 43 being used as the mask. The wiring 23 can be electrically connected to the metal films 21A at the bottom of the through holes 24.

Figure 22:
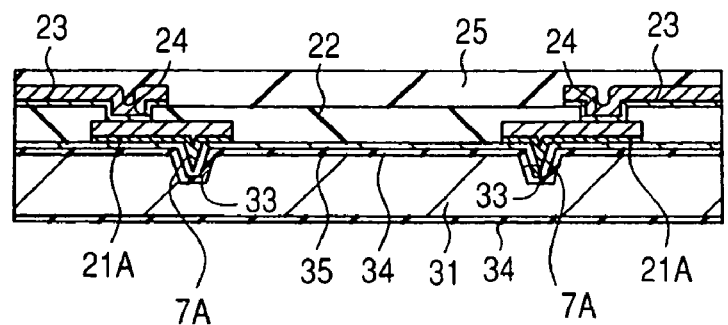
FIG. 22 is a sectional view of essential parts during the fabricating process of the membrane probe following FIG. 21.

Then, as shown in FIG. 22, a polyimide film (second polyimide film) 25 is formed over the main face of the wafer 31. This polyimide film 25 serves as the adhesive layer for the metal films 45 (see FIG. 8) to be fastened to the main face of the wafer 31 at a subsequent step.

Figure 23:
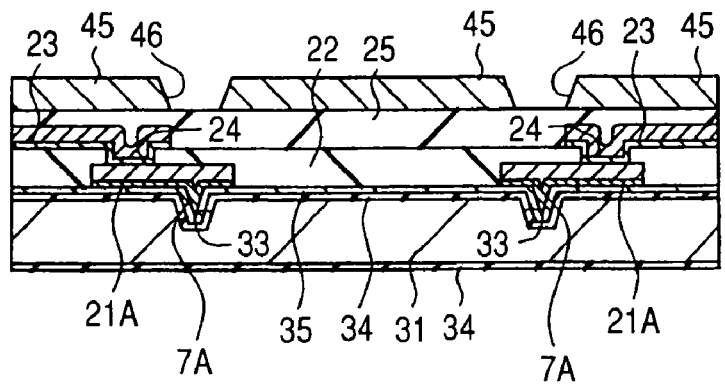
FIG. 23 is a sectional view of essential parts during the fabricating process of the membrane probe following FIG. 22.

Next, as shown in FIG. 23, the metal films (second sheets) 45 are fastened to the upper face of the polyimide film 25. For these metal films 45, a material whose linear expansion coefficient is low and is close to that of the wafer 31 formed from silicon is to be selected, and in this Embodiment 1 it can be, for instance, 42 alloy (an alloy of nickel and iron in a ratio of 42:58, having a linear expansion coefficient of 4 ppm/° C.) or invar (an alloy of nickel and iron in a ratio of 36:64, having a linear expansion coefficient of 1.5 ppm/° C.) Alternatively, instead of using the metal films 45, silicon films of the same material as the wafer 31 can as well be used, or a material of about an equal linear expansion coefficient to silicon, such as an alloy of iron, nickel and cobalt or a mixture of ceramic and resin may be used. Fastening of such a metal film 45 can be achieved by superposing it over the main face of the wafer 31 while aligning it, and heating it at a temperature not below the glass transition point of the polyimide film 25 while applying a pressure of about 10 to 200 kgf/cm$^2$ thereby to adhere it under heating and pressure.

By fastening such metal films 45 by using the polyimide film 25, the strength of the membrane probe HMS that is formed can be increased. Where no metal films 45 are to be fastened, the expansion or contraction of the membrane probe HMS and the wafer to be tested attributable to the temperature at the time of probing may dislocate the relative positions of the probes 7A and the matching bonding pads BPD, making it impossible for the probes 7A to come into contact with the matching bonding pads BPD. On the other hand, in this Embodiment 1, the fastening of the metal films 45 serves to enable the quantities of expansion or contraction of the membrane probe HMS and the wafer to be tested attributable to the temperature at the time of probing to be equalized. This make it possible to prevent the relative positions of the probes 7A and the matching bonding pads BPD from being dislocated. Thus, it is made possible to keeping electrical connection between the probes 7A and the matching bonding pads BPD all the time irrespective of the temperature at the time of probing. It is also made possible to secure the accuracy of the relative positions of the membrane probe HMS and the wafer to be tested in various situations.

Next, the metal films 45 are etched with the photoresist film patterned by photolithography being used as the mask, and openings (second openings) 46 are formed in the metal films 45 over the probes 7A. In this Embodiment 1, this etching can be spray etching of a ferric chloride solution.

Figure 24:
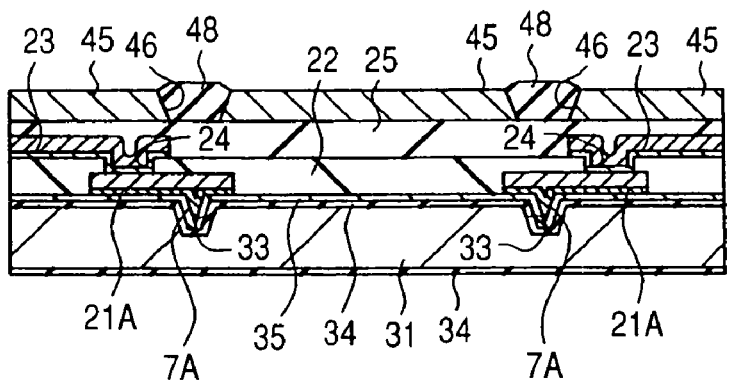
FIG. 24 is a sectional view of essential parts during the fabricating process of the membrane probe following FIG. 23.

Then, after removing the photoresist film, an elastomer 48 (see also FIG. 8) is formed within each opening 46 as shown in FIG. 24. Then, the elastomer 48 should be so formed that a prescribed quantity of overflows the top of the opening 46. In this Embodiment 1, the elastomer 48 may be formed by, for instance, printing or spreading with a dispenser an elastic resin within the opening 46 or by installing a silicon sheet. The elastomers 48, while easing the impact occurring when the tips of many probes 7A come into contact with the bonding pads BPD, absorbs unevenness in the heights of individual probes 7A by local deformation, and achieves contact between the probes 7A and the bonding pads BPD by uniform penetration following the fluctuations of the heights of the bonding pads BPD.

Figure 25:
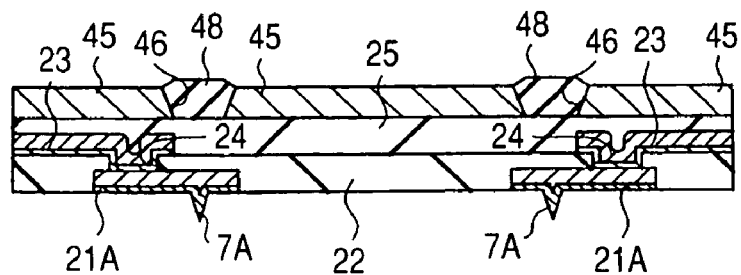
FIG. 25 is a sectional view of essential parts during the fabricating process of the membrane probe following FIG. 24.
Figure 26:
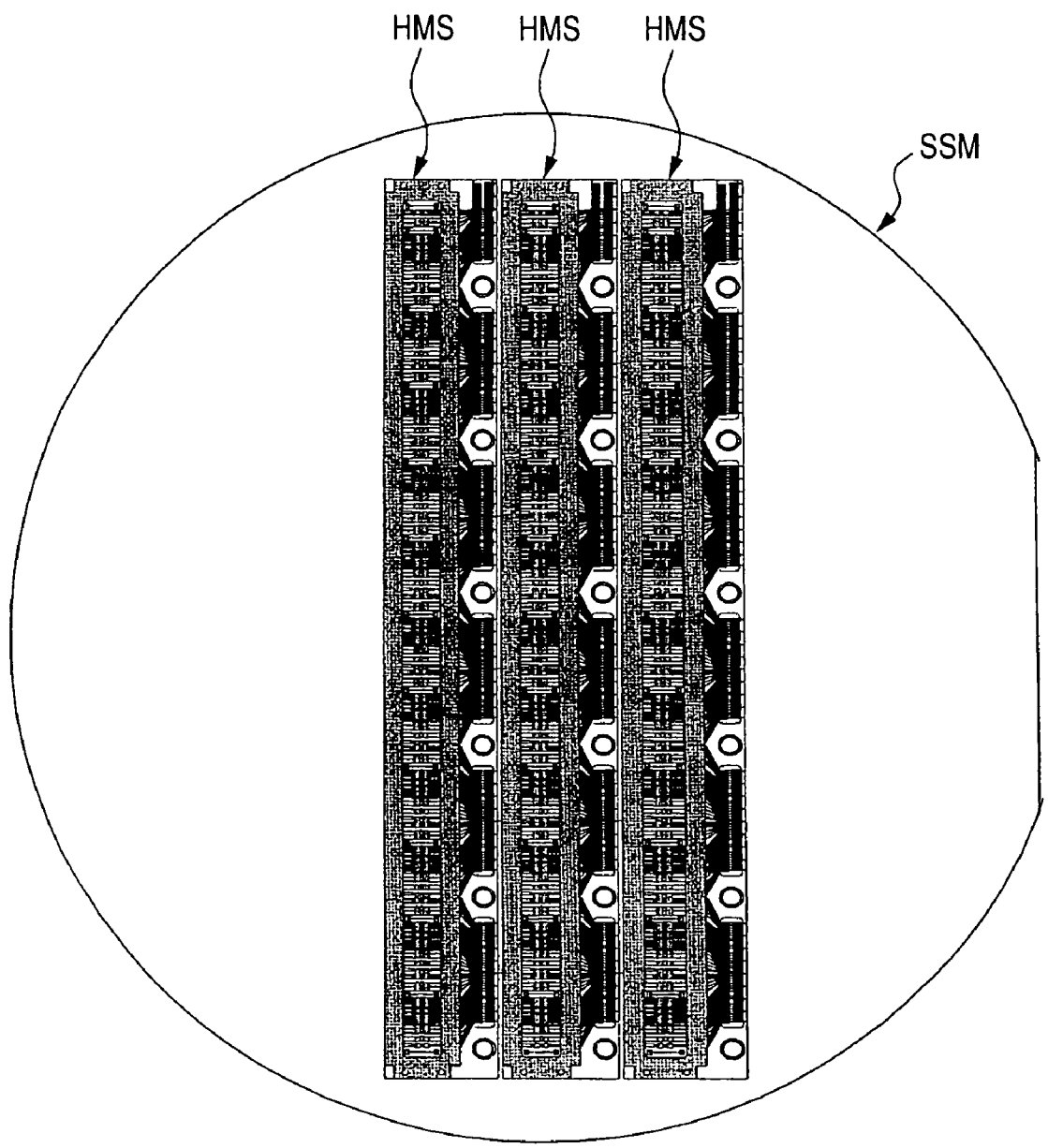
FIG. 26 is a plan of the essential parts of during the fabricating process of the membrane probe shown in FIG. 13.

Next, as shown in FIG. 25, the rear face of the wafer 31 is cleared of the silicon oxide film 34 by etching with, for instance, a mixture of hydrofluoric acid and ammonium fluoride. Then, the wafer 31 which serves as the mold for forming the membrane probe HMS is removed by etching with a strong alkali aqueous solution (for instance an aqueous solution of potassium hydroxide). Hereupon, the silicon oxide film 34 and the electroconductive film 35 are removed by successive etching. Then, the silicon oxide film 34 is etched with a mixture of hydrofluoric acid and ammonium fluoride, the chromium film contained in the electroconductive film 35 is etched with an aqueous solution of potassium permanganate, and the copper film contained in the electroconductive film 35 is etched with an alkaline copper etching solution. The process up to this point causes the rhodium film, which is the electroconductive film 37 (see FIG. 19) constituting the probes 7A, to emerge on the surface of the probes 7A. As stated above, to the probes 7A on whose surface the rhodium film is formed on the surface, aluminum (Al), which is the material of the bonding pads BPD with which the probes 7A come into contact, can hardly stick, and accordingly the rhodium film, which is harder than Ni and resists oxidation, can serve to stabilize the contact resistance. Here, FIG. 26 shows a plan at the time when the process described with reference to FIG. 25 has been completed, illustrating a state in which external shapes of a plurality of membrane probes HMS are formed within a laminated film of polyimide films (thin-film sheet) SSM having the external shape of the wafer 31.

Next, cuts KRK (see FIG. 13) are formed by laser cutting. Then, the laminated film SSM is divided into individual membrane probes HMS matching adhesive holders SHD (see FIG. 6 for instance) to fabricate the membrane probes HMS of this Embodiment 1.

Figure 27:
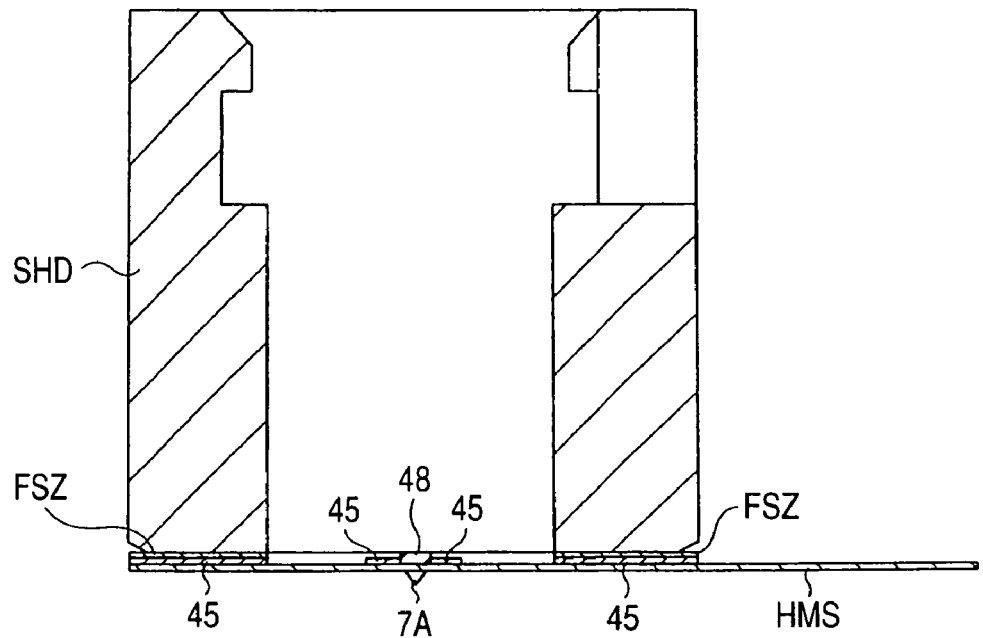
FIG. 27 is a sectional view of essential parts illustrating the step of fitting the membrane probe shown in FIG. 13 to the adhesive holder.
Figure 28:
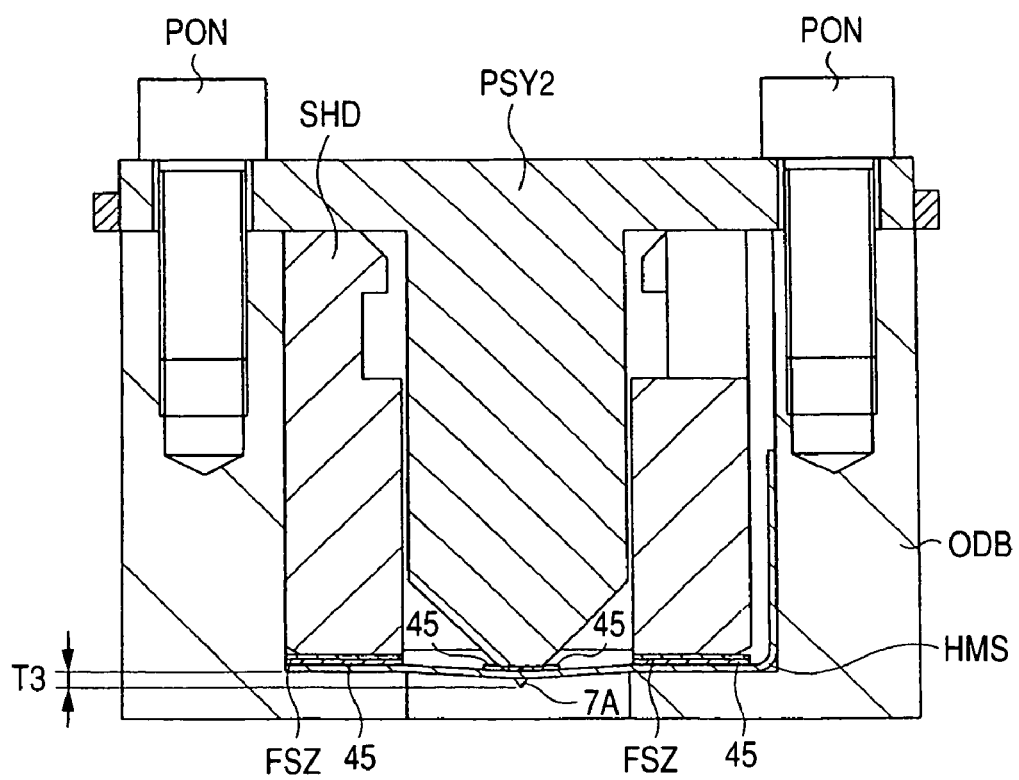
FIG. 28 is another sectional view of essential parts illustrating the step of fitting the membrane probe shown in FIG. 13 to the adhesive holder.

FIG. 27 and FIG. 28 are sectional views of essential parts illustrating the step of assembling the pusher PSY including the step of fitting the membrane probes to the adhesive holders SHD (also see FIG. 3 and FIG. 6).

When fitting a membrane probe HMS to an adhesive holder SHD, as shown in FIG. 27, first the rear face of the membrane probe HMS, where no probe 7A is formed, is aligned with the bottom face of the adhesive holder SHD by using a filmy adhesive FSZ mainly including an epoxy material for instance, and then it is adhered.

Next, as shown in FIG. 28, pre-extrusion is applied by using a membrane probe extrusion jig to the membrane probe HMS stuck to the adhesive holder SHD. The membrane probe protrusion jig is formed of an extrusion block ODB, a pusher PSY2, a pusher extrusion screw PON and so forth. This pre-extrusion treatment comprises, first, fitting the adhesive holder SHD to which the membrane probe HMS is adhered to the extrusion block ODB, followed by fitting the pusher PSY2 to the extrusion block ODB and fastening the pusher extrusion screw PON to have the pusher PSY2 extrude the membrane probe HMS from the rear face toward the main face (the face over which the probes 7A are formed). In this Embodiment 1, the extrusion quantity T3 of the membrane probe HMS then can be about 0.4 mm for instance. In this state in which the membrane probe HMS is extruded, the membrane probe extrusion jig is subjected to heat treatment at about 125° to perform film extension.

The pre-extrusion treatment is intended to accustom the membrane probe HMS in advance to the shape in which it is pressed by the POGO pins PGP2 to prevent, when the membrane probe HMS is pressed from the rear side by the POGO pins PGP2 (see FIG. 8) subsequently, unnecessary stresses from working on the membrane probe HMS to dislocate the relative positions of the probes 7A and the bonding pads BPL (see FIG. 9) of the chip CHP (see FIG. 9).

After the pre-extrusion treatment described above, the POGO pin insulator PIL1 provided with the POGO pins PGP2 is fitted to the adhesive holder SHD, the FPC connector CN1 provided with the flexible print wiring cable FPC1 and the chip condenser YRS is fitted to the adhesive holder SHD, and the membrane probe HMS and the flexible print wiring cable FPC1 are press-joined with the screw CNJ2 to form the pusher PSY.

Figure 29:
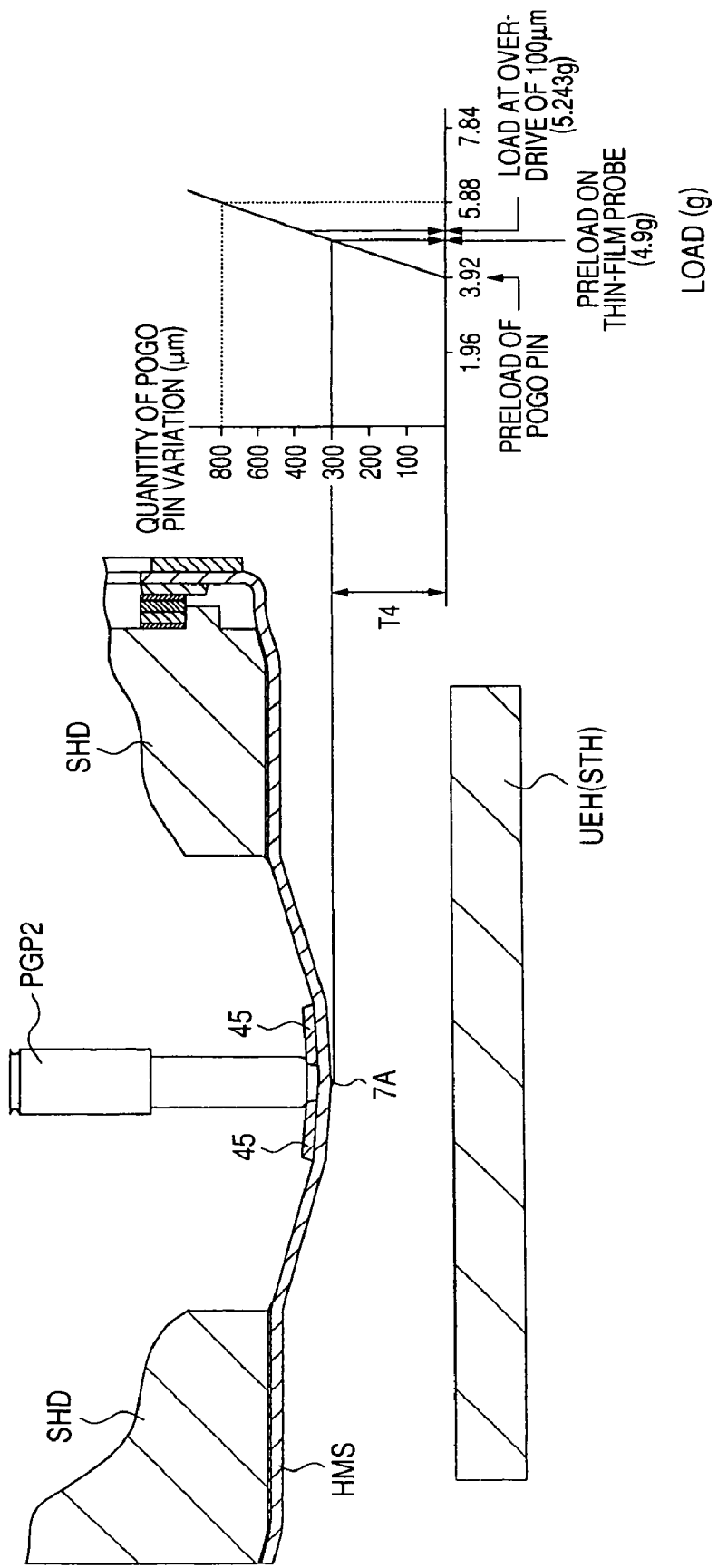
FIG. 29 illustrates how the load per probe increases with an increase in the quantity of the overdrive of the probe card shown in FIG. 1.
Figure 30:
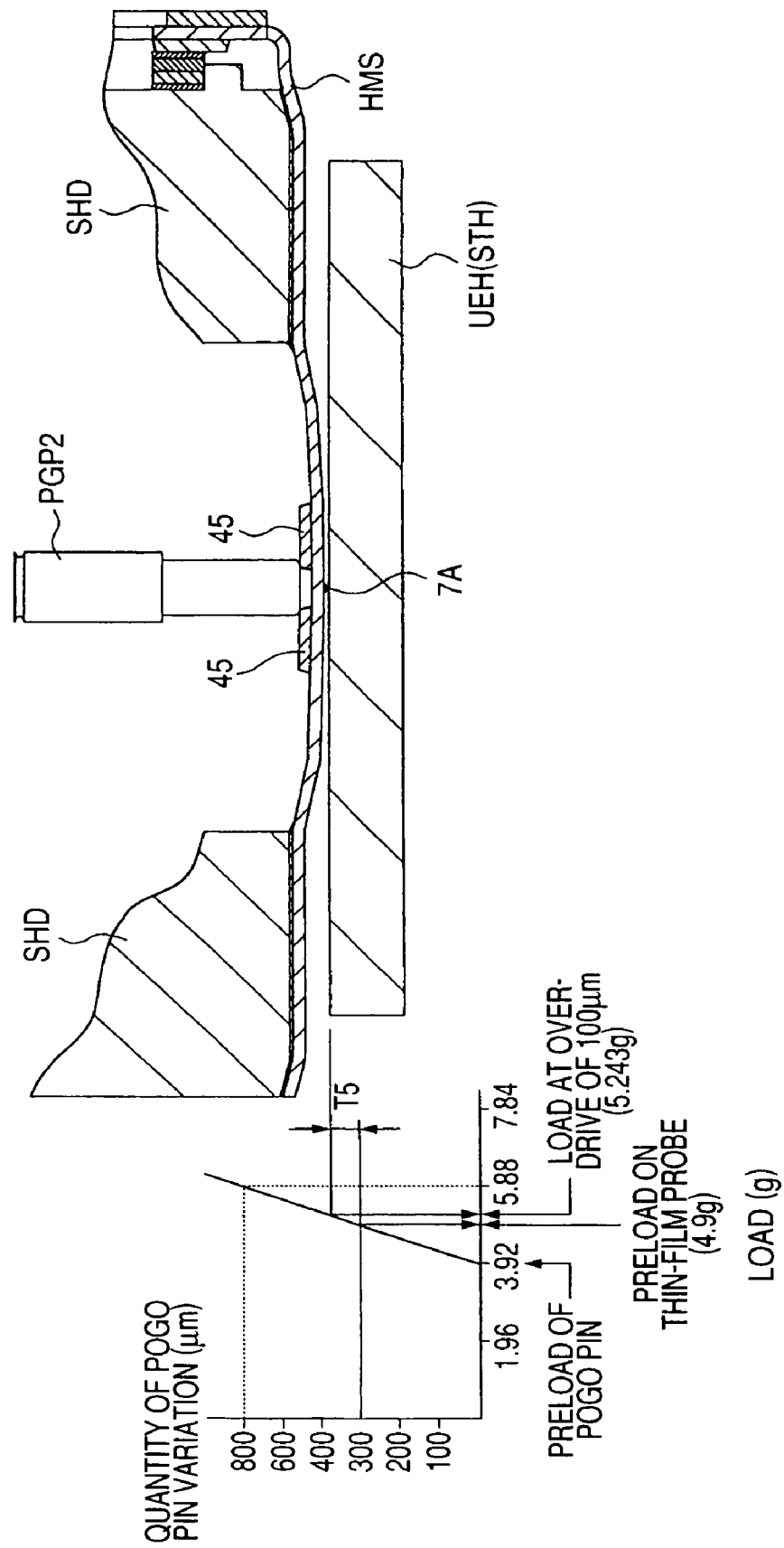
FIG. 30 also illustrates how the load per probe increases with an increase in the quantity of the overdrive of the probe card shown in FIG. 1.

FIG. 29 through FIG. 31 illustrate how the load per probe 7A increases with an increase in the quantity of the overdrive of the probe card of this Embodiment 1.

In this Embodiment 1, the overdrive means so operating the stage heater STH (see FIG. 2) mounted with the probe card or the wafer UEH, after the tips of the probes 7A have come into contact with the bonding pads BPD (see FIG. 12), as to apply a further load on the probes 7A. The quantity of this operation is the quantity of overdrive (denoted by T5 in FIG. 30). The preload means the load of advance pressing of the membrane probe HMS by the POGO pins PGP2. It works on the tip of a probe 7A when the probe 7A has come into contact with a bonding pad BPD. The membrane probe HMS is extruded in advance by a distance T1 by the pressure of the POGO pins PGP2, and in this Embodiment 1 this distance T4 can be about 300 μm for instance. Further in this Embodiment 1, this distance T4 is referred to as the preload quantity. As shown in FIG. 29, in this Embodiment 1, the preload at the time the POGO pins PGP2 have extruded the membrane probe HMS by about 300 μm is approximately 3.92 g. Further in FIG. 31, the load working per probe 7A is expressed in the value in a case in which one POGO pin PGP2 presses three probes 7A. The increase rate of the load per probe 7A is stated on the basis of a case in which the value at the time of 100 μm in overdrive quantity is supposed to be 100%.

As shown in FIG. 29 through FIG. 31, the preload works on a probe 7A when the probe 7A has come into contact with a bonding pad BPD. The quantity of the POGO pins PGP2 then is about 300 μm (see FIG. 29 and FIG. 30). It is followed by overdrive, and the load applied from the POGO pins PGP2 relative to the overdrive quantity and the load per probe do not abruptly vary (increase) and instead only gradually vary (increase). Thus, it is made possible to keep the load light and perform uniform load control over a wide range of overdrive quantity. This makes it possible, even if the height differs among the plurality of bonding pads BPD, to enhance the compliance of the respectively matching probes 7A to the height differences, and suitable pressure control can be achieved over all the probes 7A. As a result, it is made possible to prevent depressions, which are left in the bonding pads BPD after the probes 7A are brought into contact with the bonding pads BPD at the time of probing, from becoming uneven in distinctiveness. This prevention of uneven distinctiveness of the depressions can prevent the probes 7A from being crushed or otherwise damaged, and achieve suitable pressure control over all the probes 7A. The prevention of uneven distinctiveness of the depressions can also serve to prevent faulty contact between the probes 7A and the bonding pads BPD.

The load working from the POGO pins PGP2 on the membrane probe HMS and the load working on the probes 7A can be controlled even more finely by, for instance, increasing or decreasing the quantity of overdrive or the quantity of preload, altering the POGO pins PGP2 (the spring constant of the springs built into the POGO pins PGP2) and altering the number of POGO pins PGP2.

Figure 32:
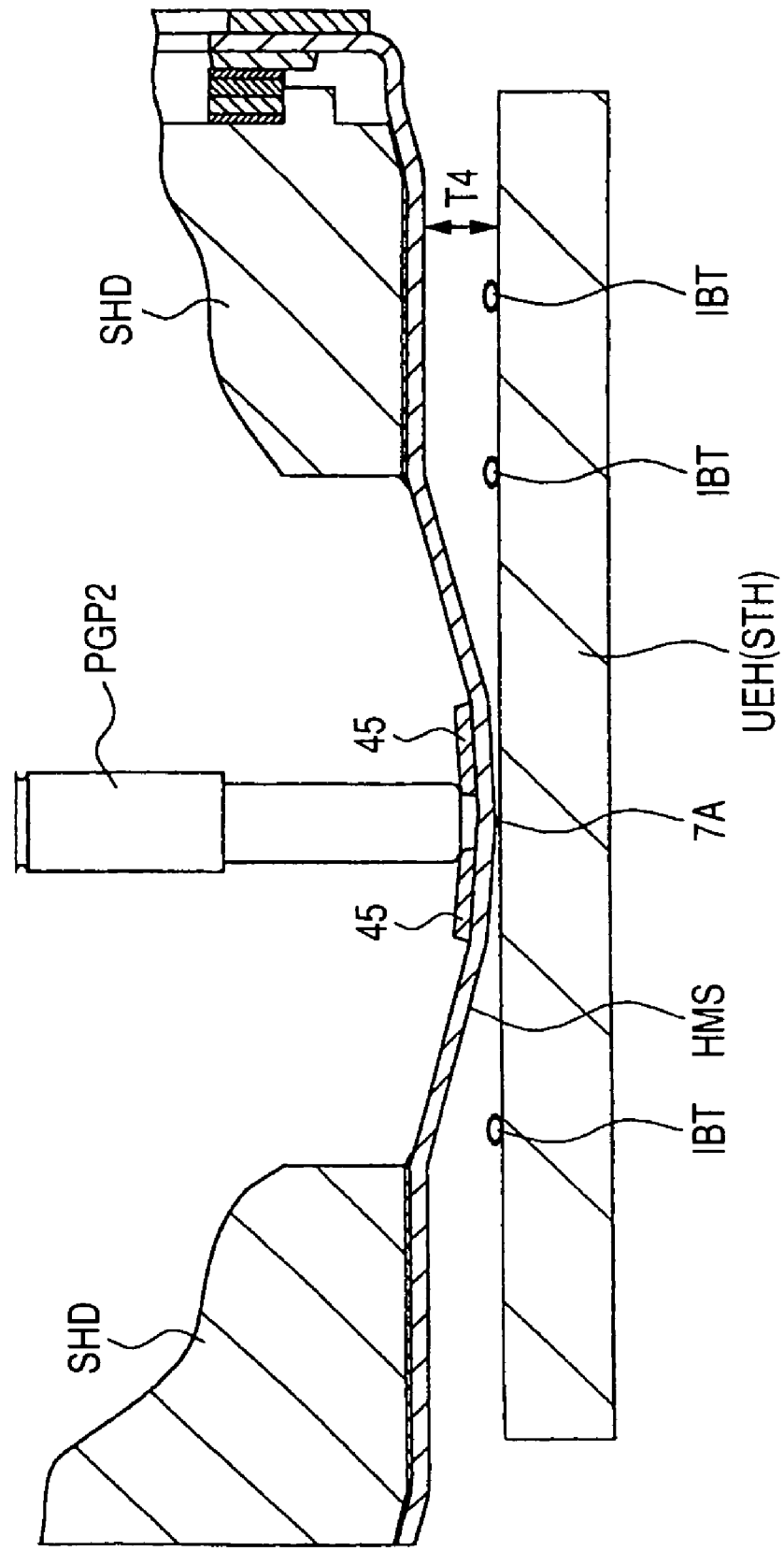
FIG. 32 is a sectional view of essential parts for illustrating an anti-foreign matter measure for the probe card shown in FIG. 1.

Further, as described above, the membrane probe HMS is extruded in advance by about 300 μm. For this reason, as shown in FIG. 32, even if foreign matter IBT is stuck to the surface of the wafer UEH to be tested, it is possible to prevent the trouble that, when the probes 7A are brought into contact with the bonding pads BPD, the membrane probe HMS and the foreign matter IBT come into contact with each other to damage the membrane probe HMS.

The probe card of this Embodiment 1 performs probing covering a plurality of chips CHP (see FIG. 12) in a single touchdown on the wafer UEH to be tested (see FIG. 2). It can probe, for instance, 110 chips CHP in a touchdown. Further in this Embodiment 1, 484 chips CHP are supposed to be acquired from a wafer UEH of, for instance, about 300 μm in diameter. Under such conditions, the probe card of this Embodiment 1 can come into contact with all the chips CHP in the wafer UEH in six touchdowns.

Figure 33:
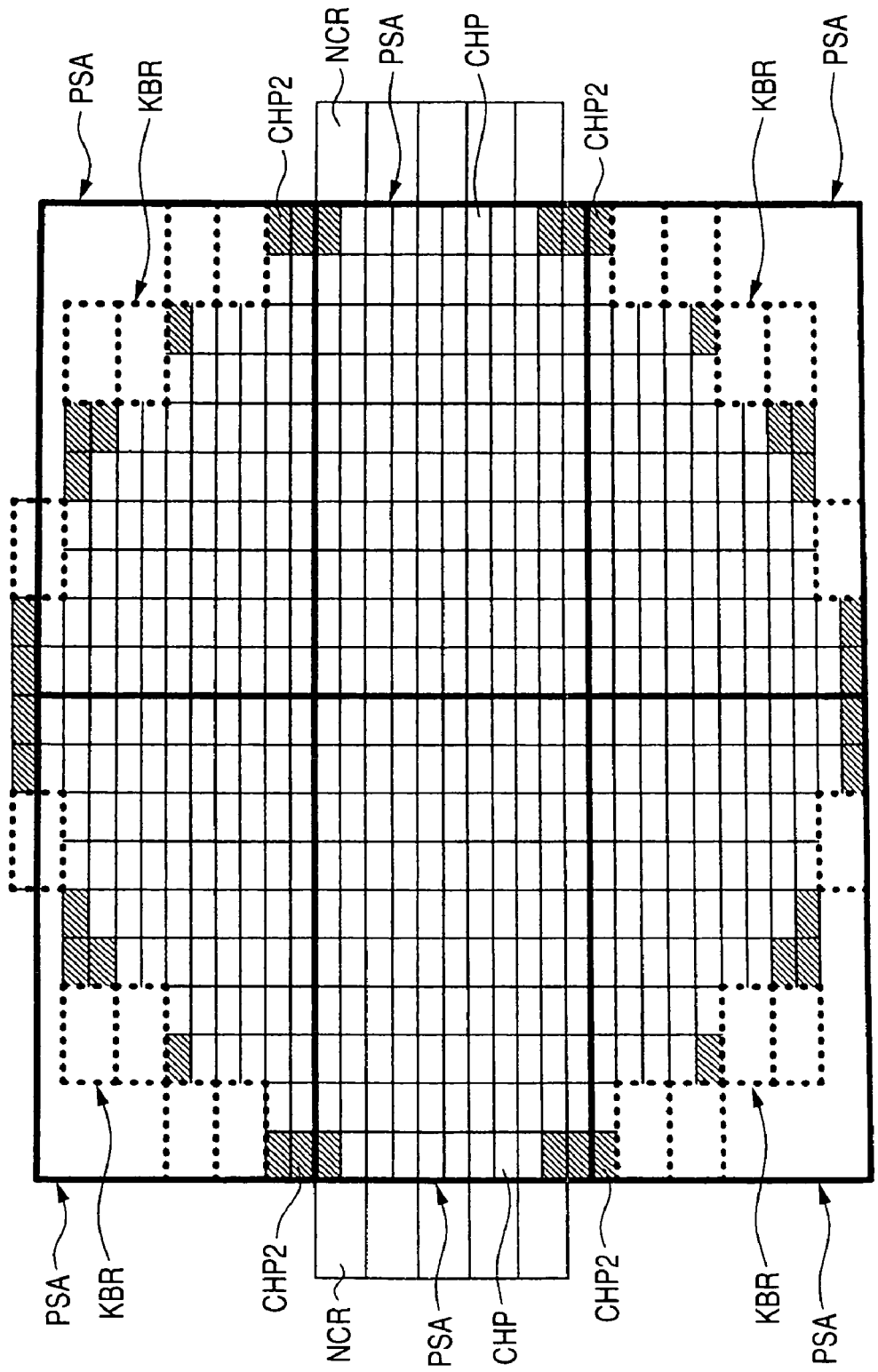
FIG. 33 illustrates, among others, the array layout of chips formed in the wafer face to be probed by using the probe card shown in FIG. 1 and the areas which the probe card come into contact with in one touchdown.

FIG. 33 here illustrates, among others, the array layout of chips formed in the face of the wafer UEH and the areas PSA which the probe card of this Embodiment 1 comes into contact with in one touchdown. In FIG. 33, in the areas KBR indicated by dotted lines, some of the probes 7A formed in a single membrane probe HMS come into contact with the wafer UEH (bonding pads BPD) while other probes 7A go off the wafer UEH. Further in FIG. 33, the areas PSA are indicated by bold lines, unacceptable chips CHP2 are hatched, and the areas NCR where no chip is formed in the wafer UEH are also shown.

Figure 34:
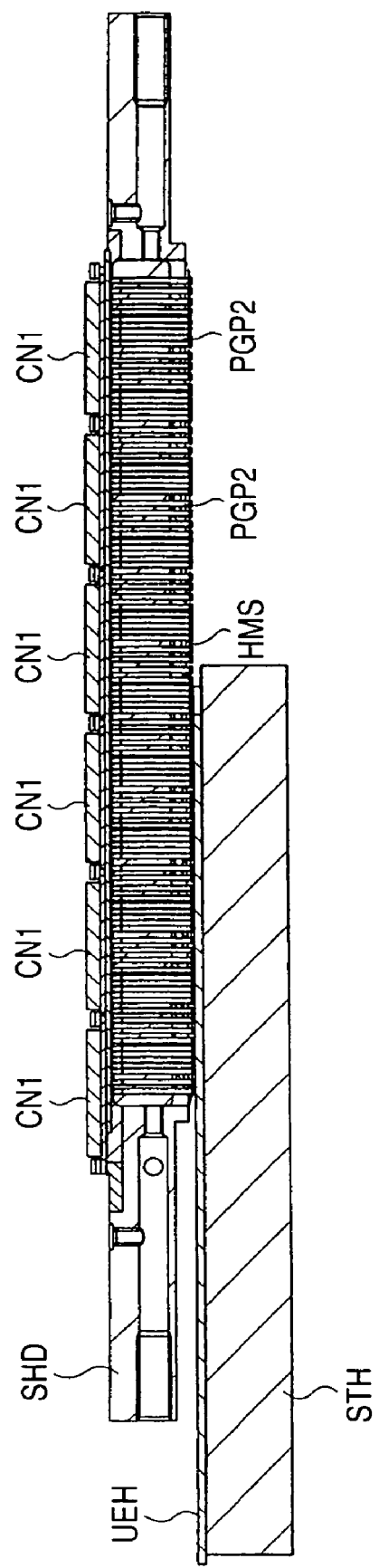
FIG. 34 is a sectional view of essential parts for illustrating how the probe card shown in FIG. 1 touches down on the wafer to be probed and its outer circumferential part.

In the membrane probe HMS which comes into contact with the wafer UEH (bonding pads BPD) in the areas KBR, since some of the probes 7A go off the wafer UEH (see FIG. 34), the probe card is momentarily inclined when the probes 7A which do not go off the wafer UEH come into contact with the bonding pads BPD, and it is feared stresses may concentrate on the probes 7A in contact with the bonding pads BPD do damage those probes 7A. In this Embodiment 1, however, the cut KRK (see FIG. 13) is provided in the membrane probe HMS as mentioned above, and the compliance of the probes 7A to height differences is thereby enhanced to make possible suitable pressure control over all the probes 7A. Also as described with reference to FIG. 1 through FIG. 5, in the probe card of this Embodiment 1, control is performed separately over each of the plurality of adhesive holders SHD held by the pressurizing structure. Further as described with reference to FIG. 29 through FIG. 31, the probe card of this Embodiment 1 can keep the load light and perform uniform load control over a wide range of overdrive quantity. Accordingly, the compliance of the probes 7A to height differences is thereby enhanced to make possible suitable pressure control over all the probes 7A. This makes possible prevention of stress concentration on the probes 7A when they have come into contact with the bonding pads BPD. In other words, any damage to the probes 7A attributable to stress concentration can be prevented.

Embodiment 2

Figure 35:
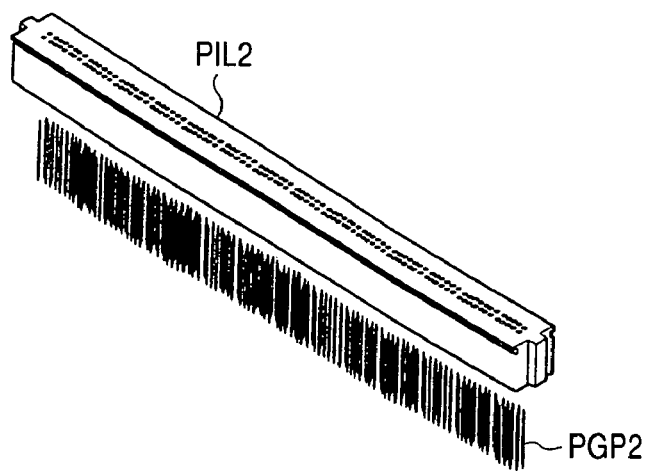
FIG. 35 is a perspective view of a POGO pin insulator included in the probe card used for probing in the fabricating process of a semiconductor integrated circuit device, which is Embodiment 2 of the invention.
Figure 36:
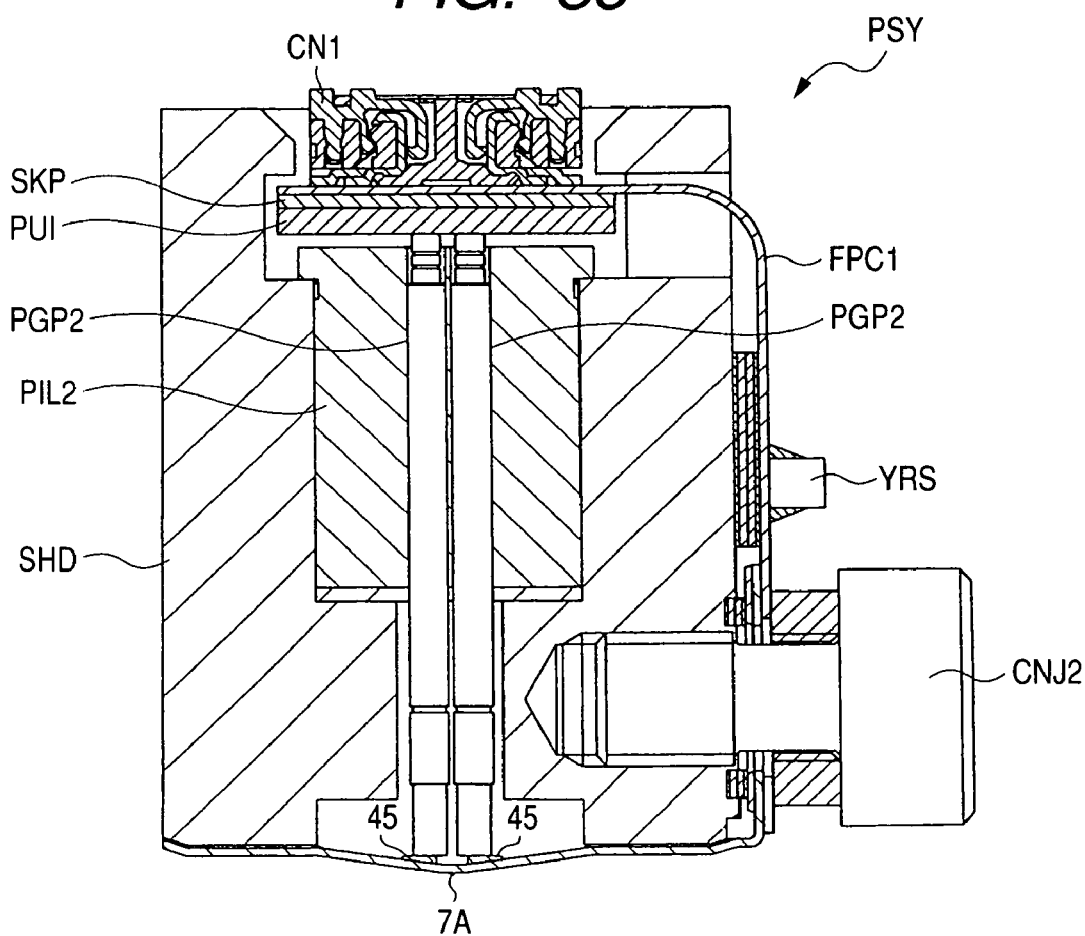
FIG. 36 is a sectional view, in a state in which the POGO pin insulator shown in FIG. 35 is incorporated into the adhesive holder, of a structural unit which they constitute.

The foregoing Embodiment 1 has a structure in which the POGO pins PGP2 press the elastomers 48 on the probes 7A (see FIG. 6 and FIG. 8), but this Embodiment 2 has a structure in which the POGO pins PGP2 press both of the metal films 45 so arranged as hold those elastomers 48 between them and those elastomers 48 are dispensed with. In all other respects, this embodiment is the same as the foregoing Embodiment 1. FIG. 35 is a perspective view of a POGO pin insulator PIL2 of this Embodiment 2 holding the POGO pins PGP2 and FIG. 36, a sectional view, in a state in which the POGO pin insulator PIL2 is incorporated into the adhesive holder SHD, of a structural unit which they constitute.

The POGO pin insulator PIL2 is the same as the POGO pin insulator PIL1 in the foregoing Embodiment 1 except in the position and the number of the POGO pins PGP2 it holds.

In this Embodiment 2, more of the POGO pins PGP2 are arranged than in the foregoing Embodiment 1. This feature enables the load applied by the POGO pins PGP2 on the membrane probe HMS and the load working on the probes 7A to be controlled than in the foregoing Embodiment 1.

This Embodiment 2 described above can provide similar effects to the foregoing Embodiment 1.

Embodiment 3

The probe card of this Embodiment 3 has a pusher different in structure from the pusher PSY (see FIG. 6 and FIG. 8) in the probe card of the foregoing Embodiment 1.

Figure 37:
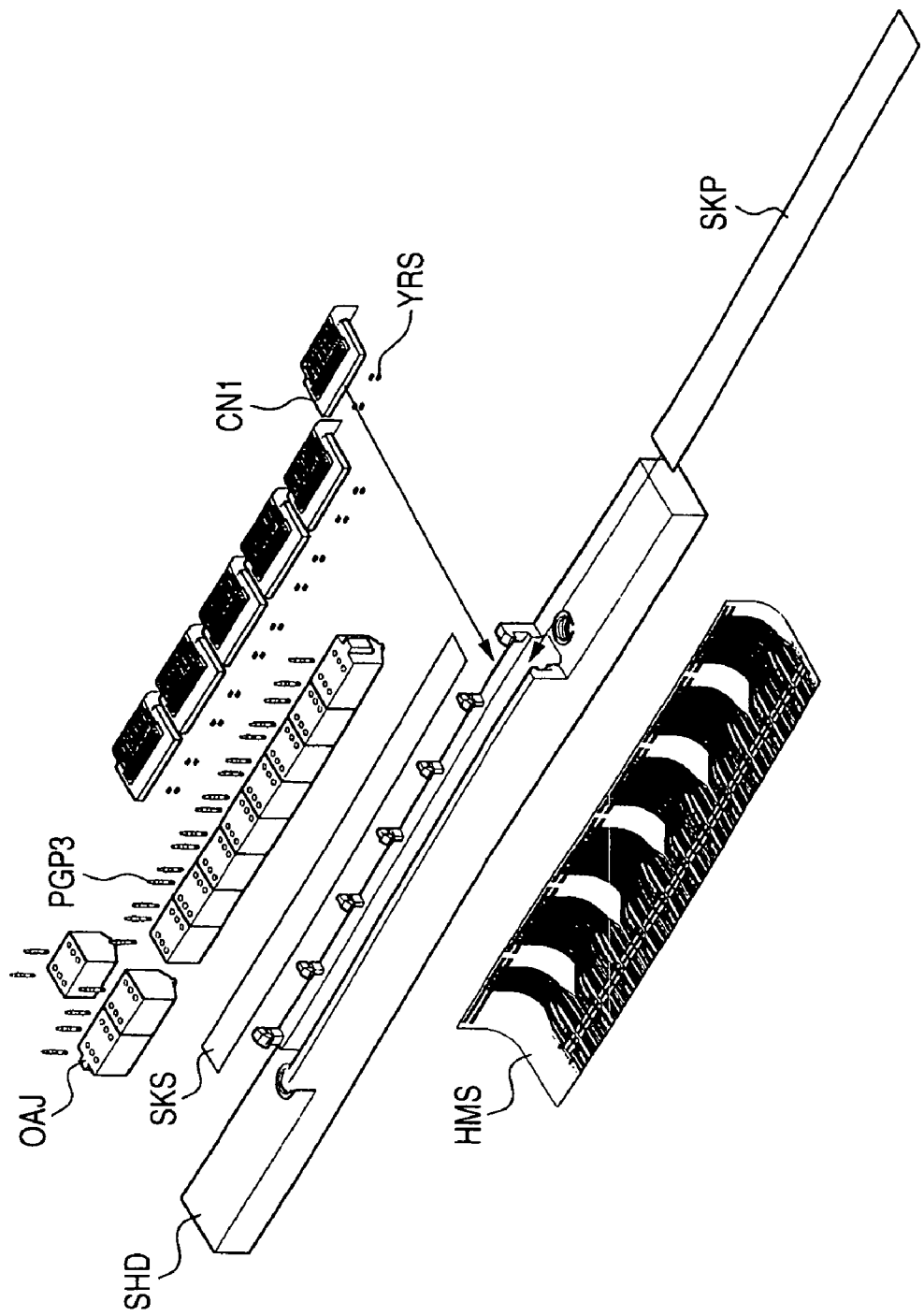
FIG. 37 is a perspective view illustrating the structure of a pusher included in the probe card used for probing in the fabricating process of a semiconductor integrated circuit device, which is Embodiment 3 of the invention.
Figure 38:
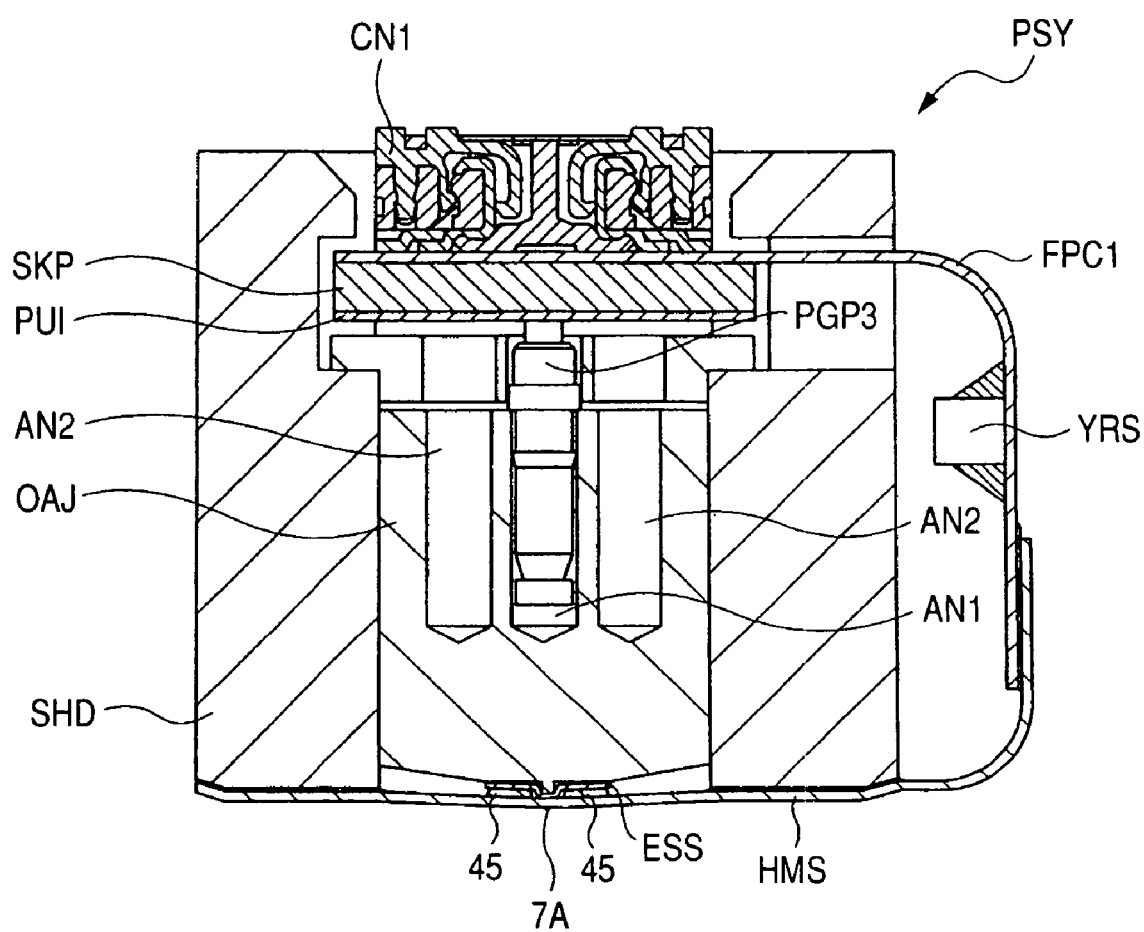
FIG. 38 is a sectional view of the essential parts of the pusher shown in FIG. 37.

FIG. 37 is a perspective view illustrating the structure of the pusher PSY of this Embodiment 3 and FIG. 38, a sectional view of the essential parts thereof.

In this Embodiment 3, pressing mechanisms OAJ of sizes matching individual chips CHP are used, as shown in FIG. 37, in place of the POGO pin insulator PIL1 in the foregoing Embodiment 1. These pressing mechanisms OAJ, are formed of ceramic for instance. A one-side driven type POGO pin PGP3 is inserted into a hole AN1 bored in the pressing mechanism OAJ, and the pressing of the pressing mechanism OAJ by this POGO pin PGP3 causes the tip of the pressing mechanism OAJ to press the part of the membrane probe HMS in which the probes 7A are formed. A thin elastomer sheet ESS, arranged between the pressing mechanism OAJ and the membrane probe HMS, performs the same function as the elastomer 48 in the foregoing Embodiment 1.

A supplementary hole AN2 is bored in the pressing mechanism OAJ side by side with the hole AN1. By arranging a POGO pin PGP3 in this supplementary hole AN2, too, the load applied by the pressing mechanism OAJ on the membrane probe HMS and the load working on the probes 7A can be controlled even more finely than the foregoing Embodiment 1.

This Embodiment 3 described above can provide similar effects to the foregoing Embodiments 1 and 2.

Embodiment 4

Figure 39:
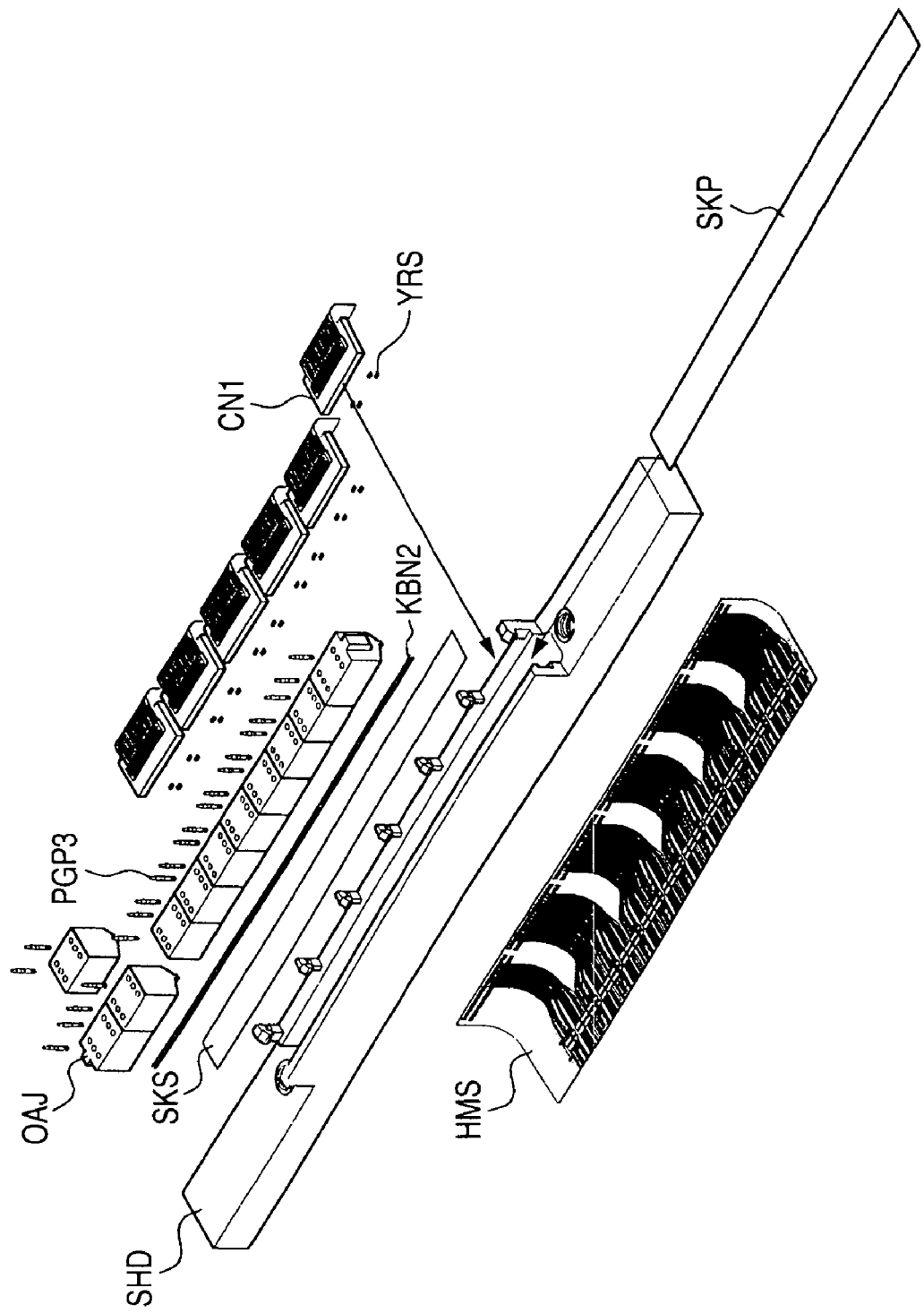
FIG. 39 is a perspective view illustrating the structure of a pusher included in the probe card used for probing in the fabricating process of a semiconductor integrated circuit device, which is Embodiment 4 of the invention.
Figure 40:
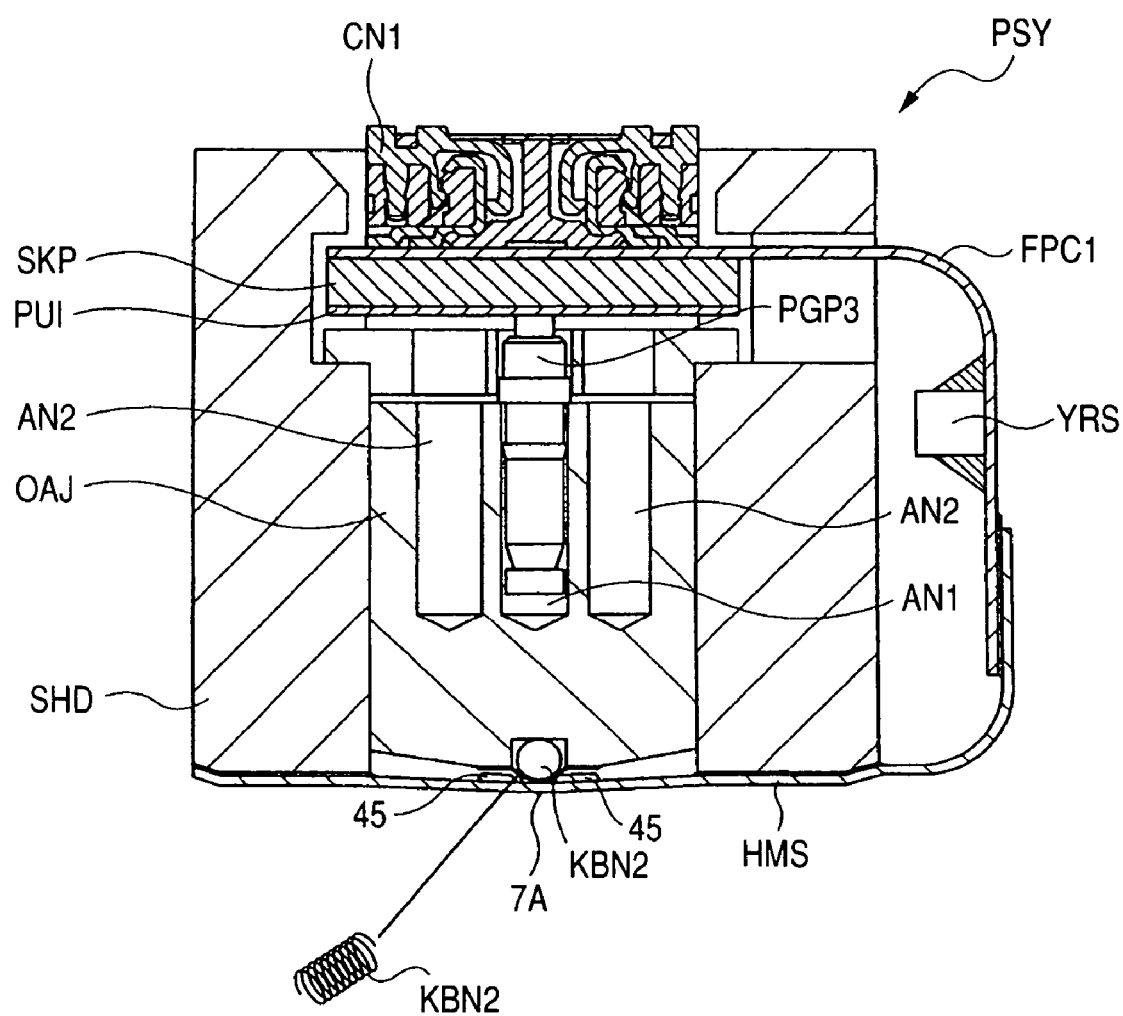
FIG. 40 is a sectional view of the essential parts of the pusher shown in FIG. 39.

FIG. 39 is a perspective view illustrating the structure of the pusher PSY included in this Embodiment 4 and FIG. 40, a sectional view of the essential parts thereof.

In this Embodiment 4, the pressing mechanism OAJ, described with reference to the foregoing Embodiment 3 as well, is so structured as to press the membrane probe HMS via a coil spring KBN2. This coil spring KBN2 is about 0.5 mm in diameter for instance, about 0.07 mm in coil pitch and about 9 mm in free length. It is more preferable for the free length to be about 10 mm and the whole circumference to be insulated.

In this Embodiment 4, the load applied by the pressing mechanism OAJ on the membrane probe HMS and the load working on the probes 7A can be controlled even more finely than the foregoing Embodiment 3.

This Embodiment 4 described above can provide similar effects to the foregoing Embodiments 1 through 3.

Embodiment 5

Figure 41:
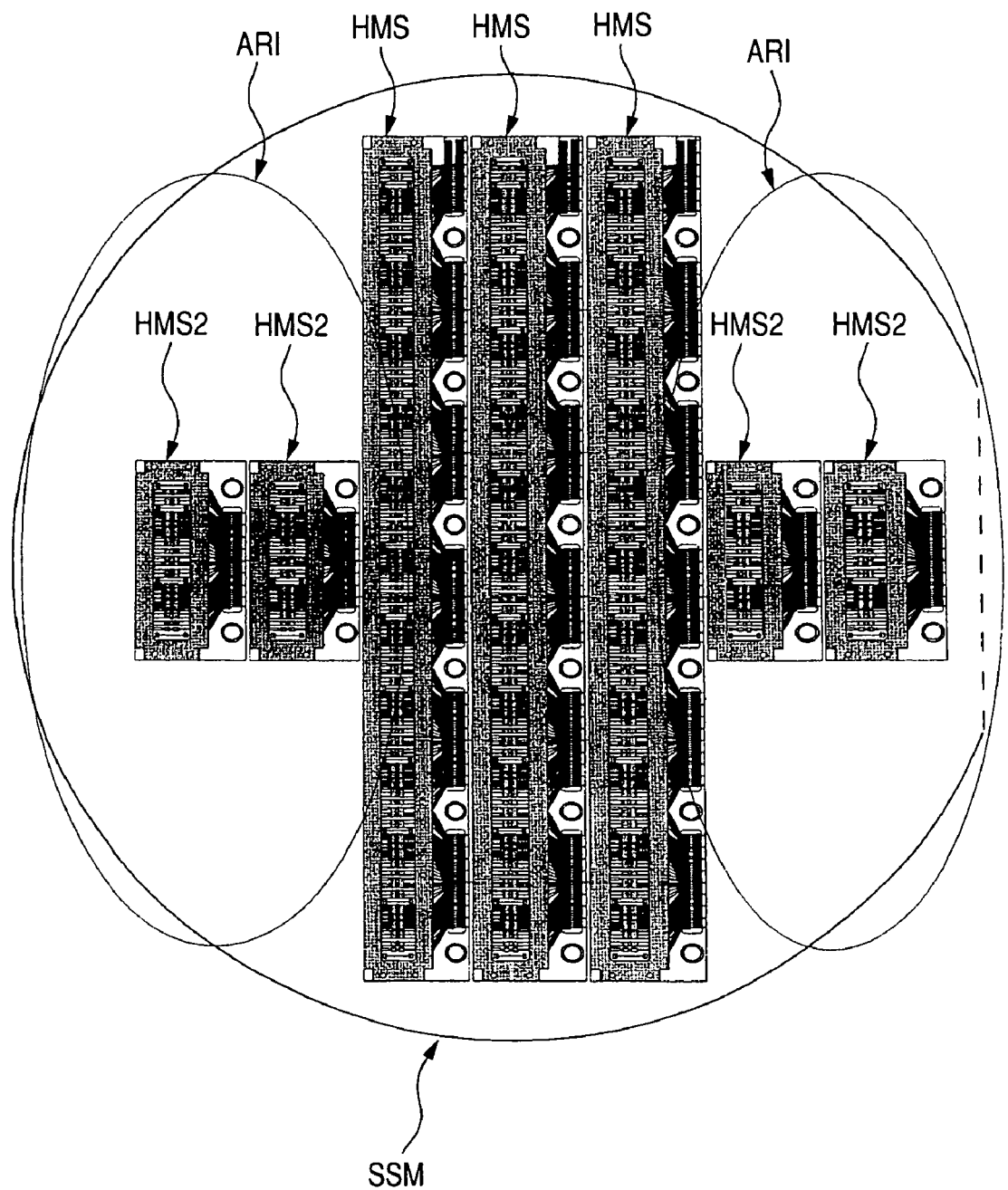
FIG. 41 is a plan of essential parts during the fabricating process of a membrane probe included in the probe card used for probing in the fabricating process of a semiconductor integrated circuit device, which is Embodiment 5 of the invention.

FIG. 41 is a plan of essential parts during the fabricating process of the membrane probe HMS of this Embodiment 5 in a state immediately before cutting into individual membrane probes HMS.

As described regarding the foregoing Embodiment 1 with reference to FIG. 18 through FIG. 25, with the wafer 31 being used as the mold, a silicon wafer is formed in a similar wafer process to the fabrication process of semiconductor integrated circuits, with the result that the planar appearance of the laminated film SSM resembles that of the wafer 31. In this Embodiment 5, in this laminated film SSM no membrane probe HMS is formed and in a vacant area ARI where no sufficient space for forming the membrane probe HMS can be secured, a membrane probe HMS2 for use in the probing of other products is formed. This membrane probe HMS2 is to be incorporated into another probe card than the probe card into which the membrane probe HMS is to be incorporated, and is applied to the probing of other chips such as Systems on Chip (SoC), liquid crystal display (LCD) drivers or logic ICs, other than AND type flash memories to which the membrane probe HMS can be applied. This makes possible efficient utilization of the laminated film SSM in which the membrane probe HMS is to be formed.

Further, though not illustrated, it is also acceptable to cut out in advance a plurality of types of membrane probes including the membrane probe HMS from a plurality of laminated films SSM, and to form a single probe card by using the plurality of types of membrane probes. In this case, it is supposed that a chip for measuring threshold voltages of MISFETs, other than the chip CHP (see FIG. 12 and FIG. 33) of the AND type flash memory for instance, is formed over the wafer UEH (see FIG. 2). The MISFET included in this chip is formed in the same process as the MISFET included in the chip CHP. The configuration of this Embodiment 5 makes possible proving with a single probe card even where a plurality of types of chips are formed over the wafer UEH to be tested.

Although the invention accomplished by the present inventors has been described so far in specific terms with reference to preferred embodiments thereof, obviously the invention is not limited to these embodiments but can be modified in various ways without deviating from its true spirit and scope.

The manufacturing method semiconductor integrated circuit devices according to the invention can be extensively applied to the probing step in the manufacturing process of semiconductor integrated circuit devices for instance.

What is claimed is:

1. A manufacturing method of semiconductor integrated circuit devices comprising the steps of:
    (a) preparing a semiconductor wafer which is partitioned into a plurality of chip areas, a semiconductor integrated circuit being formed in each of the chip areas, and in which a plurality of first electrodes to be electrically connected to said semiconductor integrated circuits are formed over the main face thereof;
    (b) preparing a first card having a wiring board over which a first wiring is formed; a plurality of first sheets wherein a plurality of contact terminals to be brought into contact with the first electrodes and a second wiring to be electrically connected to the contact terminals are formed, said second wiring is electrically connected to said first wiring, and the tips of the contact terminals are opposite the main face of said semiconductor wafer, a plurality of sheet holding devices which hold on the bottom face matching ones of the first sheets and are held by said wiring board, a plurality of third wirings for electrically connecting said second wiring and said first wiring, and a plurality of pressing mechanisms for pressing from the rear face a plurality of first areas out of said first sheets in which one or more of said contact terminals are formed; and
    (c) electrically testing said semiconductor integrated circuits by bringing said tips of the contact terminals into contact with the first electrodes,
    wherein the first sheets are formed by a process including the steps of:
    (b1) preparing one first substrate having crystallinity;
    (b2) forming a plurality of pyramidal or prismoidal first holes by selectively and anisotropically etching said first substrate;
    (b3) selectively forming above each of the first holes a plurality of first metal films into which the first holes are to be embedded;
    (b4) forming a first polyimide film over said first substrate and the first metal films;
    (b5) forming a plurality of first openings reaching the first metal films by selectively etching said first polyimide film;
    (b6) forming over said first polyimide film a second metal film into which the first openings are to be embedded, and forming by patterning said second metal film a plurality of said second wirings to be electrically connected to the first metal films;
    (b7) forming a second polyimide film over the second wirings and said first polyimide film;
    (b8) adhering a second sheet onto said first substrate, and forming by patterning said second sheet a plurality of second openings in said second sheet over said first metal film;
    (b9) forming a plurality of elastomers to be embedded into the second openings, in a state in which said second sheet is adhered onto said first substrate, in the second openings;
    (b10) removing said first substrate, forming the contact terminals from the first metal films, and forming one thin-film sheet containing the contact terminals, said first and second polyimide films, the second wirings, said second sheet and the elastomers; and
    (b11) cutting said thin-film sheet along divided areas to form the first sheets,
    wherein one of said first sheets matches one or more of said chip areas, and
    wherein the first sheets formed at said step (b11) are incorporated into one said first card.

2. The manufacturing method of semiconductor integrated circuit devices according to claim 1,
    wherein said third wiring is tapped from said first sheet in a single direction.

3. The manufacturing method of semiconductor integrated circuit devices according to claim 2,
wherein said third wiring is an FPC wiring.

4. The manufacturing method of semiconductor integrated circuit devices according to claim 1,
wherein a bypass condenser is electrically connected to said third wiring.

5. The manufacturing method of semiconductor integrated circuit devices according to claim 1,
wherein said second sheet is arranged in each of said first areas over said rear face of said first sheet,
wherein each of said first areas is arranged in said chip area in a position matching one or another of a plurality of second areas in which one or more of said first electrodes is arranged, and
wherein a matching one of pressing mechanisms presses each of said second sheets.

6. The manufacturing method of semiconductor integrated circuit devices according to claim 1,
wherein said sheet holding device is held by said wiring board via a fixing device for fixing said sheet holding device to said wiring board, and
wherein said fixing device is formed of a material whose thermal expansion or thermal contraction is rapidly saturated at a temperature of implementing said step (c).

7. The manufacturing method of semiconductor integrated circuit devices according to claim 6,
wherein said fixing device mainly includes titanium.

8. The manufacturing method of semiconductor integrated circuit devices according to claim 1,
wherein, at said step (c), said electrical testing of said semiconductor integrated circuits in a plurality of said chip areas is collectively accomplished by one time of contact between the contact terminals and the first electrodes.

9. A manufacturing method of semiconductor integrated circuit devices comprising:
(a) preparing a semiconductor wafer which is partitioned into a plurality of chip areas, a semiconductor integrated circuit being formed in each of the chip areas, and in which a plurality of first electrodes to be electrically connected to said semiconductor integrated circuits are formed over the main face thereof;
(b) preparing a first card having a wiring board over which a first wiring is formed; a plurality of first sheets wherein a plurality of contact terminals to be brought into contact with the first electrodes and a second wiring to be electrically connected to the contact terminals are formed, said second wiring is electrically connected to said first wiring, and the tips of the contact terminals are opposite the main face of said semiconductor wafer, a plurality of sheet holding devices which hold on the bottom face matching ones of the first sheets and are held by said wiring board, a plurality of third wirings for electrically connecting said second wiring and said first wiring, and a plurality of pressing mechanisms for pressing from the rear face a plurality of first areas out of said first sheets in which one or more of said contact terminals are formed; and
(c) electrically testing said semiconductor integrated circuits by bringing said tips of the contact terminals into contact with the first electrodes,
wherein the first sheets are formed by a process including the steps of:
(b1) preparing one first substrate having crystallinity;
(b2) forming a plurality of pyramidal or prismoidal first holes by selectively and anisotropically etching said first substrate;
(b3) selectively forming above each of the first holes a plurality of first metal films into which the first holes are to be embedded;
(b4) forming a first polyimide film over said first substrate and the first metal films;
(b5) forming a plurality of first openings reaching the first metal films by selectively etching said first polyimide film;
(b6) forming over said first polyimide film a second metal film into which the first openings are to be embedded, and forming by patterning said second metal film a plurality of said second wirings to be electrically connected to the first metal films;
(b7) forming a second polyimide film over the second wirings and said first polyimide film;
(b8) adhering a second sheet onto said first substrate, and forming by patterning said second sheet a plurality of second openings in said second sheet over said first metal film;
(b9) forming a plurality of elastomers to be embedded into the second openings, in a state in which said second sheet is adhered onto said first substrate, in the second openings;
(b10) removing said first substrate, forming the contact terminals from the first metal films, and forming one thin-film sheet containing the contact terminals, said first and second polyimide films, the second wirings, said second sheet and the elastomers; and
(b11) cutting said thin-film sheet along divided areas to form the first sheets,
wherein one of said first sheets matches one or more of said chip areas, and
wherein the first sheets formed at said step (b11) are used for said electrical testing of semiconductor integrated circuits of a plurality of types, and each is incorporated into said first card for use in said electrical testing of the matching one of said semiconductor integrated circuits.

10. The manufacturing method of semiconductor integrated circuit devices according to claim 9,
wherein said third wiring is tapped from said first sheet in a single direction.

11. The manufacturing method of semiconductor integrated circuit devices according to claim 10,
wherein said third wiring is an FPC wiring.

12. The manufacturing method of semiconductor integrated circuit devices according to claim 9,
wherein a bypass condenser is electrically connected to said third wiring.

13. The manufacturing method of semiconductor integrated circuit devices according to claim 9,
wherein said second sheet is arranged in each of said first areas over said rear face of said first sheet,
wherein each of said first areas is arranged in said chip area in a position matching one or another of a plurality of second areas in which one or more of said first electrodes is arranged, and
wherein a matching one of pressing mechanisms presses each of said second sheets.

14. The manufacturing method of semiconductor integrated circuit devices according to claim 9,
wherein said sheet holding device is held by said wiring board via a fixing device for fixing said sheet holding device to said wiring board, and wherein said fixing device is formed of a material whose thermal expansion or thermal contraction is rapidly saturated at a temperature of implementing said step (c).

15. The manufacturing method of semiconductor integrated circuit devices according to claim 14,
wherein said fixing device mainly includes titanium.

16. The manufacturing method of semiconductor integrated circuit devices according to claim 9,
wherein, at said step (c), said electrical testing of said semiconductor integrated circuits in a plurality of said chip areas is collectively accomplished by one time of contact between the contact terminals and the first electrodes.

17. A manufacturing method of semiconductor integrated circuit devices comprising the steps of:
   (a) preparing a semiconductor wafer which is partitioned into a plurality of chip areas, a semiconductor integrated circuit being formed in each of the chip areas, and in which a plurality of first electrodes to be electrically connected to said semiconductor integrated circuits are formed over the main face thereof;
   (b) preparing a first card having a wiring board over which a first wiring is formed; a plurality of first sheets wherein a plurality of contact terminals to be brought into contact with the first electrodes and a second wiring to be electrically connected to the contact terminals are formed, said second wiring is electrically connected to said first wiring, and the tips of the contact terminals are opposite the main face of said semiconductor wafer, a plurality of sheet holding devices which hold on the bottom face matching ones of the first sheets and are held by said wiring board, a plurality of third wirings for electrically connecting said second wiring and said first wiring, and a plurality of pressing mechanisms for pressing from the rear face a plurality of first areas out of said first sheets in which one or more of said contact terminals are formed; and
   (c) electrically testing said semiconductor integrated circuits by bringing said tips of the contact terminals into contact with the first electrodes,
   wherein the first sheets are formed by a process including the steps of:
   (b1) preparing a plurality of first substrates having crystallinity;
   (b2) forming a plurality of pyramidal or prismoidal first holes by selectively and anisotropically etching the first substrates;
   (b3) selectively forming above each of the first holes a plurality of first metal films into which the first holes are to be embedded;
   (b4) forming a first polyimide film over the first substrates and the first metal films;
   (b5) forming a plurality of first openings reaching the first metal films by selectively etching said first polyimide film;
   (b6) forming over said first polyimide film a second metal film into which the first openings are to be embedded, and forming by patterning said second metal film a plurality of said second wirings to be electrically connected to the first metal films;
   (b7) forming a second polyimide film over the second wirings and said first polyimide film;
   (b8) adhering a second sheet onto the first substrates, and forming by patterning said second sheet a plurality of second openings in said second sheet over said first metal film;
   (b9) forming a plurality of elastomers to be embedded into the second openings, in a state in which said second sheet is adhered onto said first substrate, in the second openings;
   (b10) removing the first substrates, forming the contact terminals from the first metal films, and forming a plurality of thin-film sheets containing the contact terminals, said first and second polyimide films, the second wirings, said second sheet and the elastomers; and
   (b11) cutting the thin-film sheets along divided areas to form the first sheets,
   wherein one of said first sheets matches one or more of said chip areas,
   wherein the first sheets formed at said step (b11) are used for said electrical testing of said semiconductor integrated circuits of a plurality of types, and
   wherein the first sheets formed at said step (b11) are incorporated into one said first card.

18. The manufacturing method of semiconductor integrated circuit devices according to claim 17,
wherein said third wiring is tapped from said first sheet in a single direction.

19. The manufacturing method of semiconductor integrated circuit devices according to claim 18,
wherein said third wiring is an FPC wiring.

20. The manufacturing method of semiconductor integrated circuit devices according to claim 17,
wherein a bypass condenser is electrically connected to said third wiring.

21. The manufacturing method of semiconductor integrated circuit devices according to claim 17,
wherein said second sheet is arranged in each of said first areas over said rear face of said first sheet,
wherein each of said first areas is arranged in said chip area in a position matching one or another of a plurality of second areas in which one or more of said first electrodes is arranged, and
wherein a matching one of pressing mechanisms presses each of said second sheets.

22. The manufacturing method of semiconductor integrated circuit devices according to claim 17,
wherein said sheet holding device is held by said wiring board via a fixing device for fixing said sheet holding device to said wiring board, and
wherein said fixing device is formed of a material whose thermal expansion or thermal contraction is rapidly saturated at a temperature of implementing said step (c).

23. The manufacturing method of semiconductor integrated circuit devices according to claim 22,
wherein said fixing device mainly includes titanium.

24. The manufacturing method of semiconductor integrated circuit devices according to claim 17,
wherein, at said step (c), said electrical testing of said semiconductor integrated circuits in a plurality of said chip areas is collectively accomplished by one time of contact between the contact terminals and the first electrodes.

* * * * *